United States Patent
Kimura et al.

(10) Patent No.: US 10,501,003 B2
(45) Date of Patent: Dec. 10, 2019

(54) SEMICONDUCTOR DEVICE, LIGHTING DEVICE, AND VEHICLE

(71) Applicant: SEMICONDUCTOR ENERGY LABORATORY CO., LTD., Atsugi-shi, Kanagawa-ken (JP)

(72) Inventors: Hajime Kimura, Kanagawa (JP); Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/210,092

(22) Filed: Jul. 14, 2016

(65) Prior Publication Data

US 2017/0019972 A1 Jan. 19, 2017

(30) Foreign Application Priority Data

Jul. 17, 2015 (JP) .................. 2015-142985

(51) Int. Cl.
  *B60Q 1/00* (2006.01)
  *H01L 49/02* (2006.01)
  (Continued)

(52) U.S. Cl.
  CPC .............. *B60Q 1/00* (2013.01); *F21S 41/141* (2018.01); *F21S 43/14* (2018.01); *H01L 27/16* (2013.01); *H01L 28/20* (2013.01); *H01L 35/12* (2013.01)

(58) Field of Classification Search
  CPC ......... G06F 1/206; H01L 35/12; H01L 28/20; H01L 27/16; B60Q 1/00; F21S 43/14; F21S 41/141
  (Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Don P Le
(74) *Attorney, Agent, or Firm* — Nixon Peabody LLP; Jeffrey L. Costellia

(57) ABSTRACT

A novel semiconductor device is provided. The semiconductor device includes a first resistor and a second resistor. The first resistor and the second resistor are electrically connected in series. A resistance material of the first resistor includes a metal oxide, and a resistance material of the second resistor is different from the resistance material of the first resistor. The semiconductor device is configured to output a voltage corresponding to the resistance values of the first resistor and the second resistor. The voltage reflects the properties of the resistance materials of the first resistor and the second resistor. The semiconductor device may include a circuit for processing this voltage. In that case, the first resistor can be stacked over the circuit, resulting in the downsizing of the semiconductor device.

24 Claims, 21 Drawing Sheets

(51) Int. Cl.
   *H01L 35/12*      (2006.01)
   *H01L 27/16*      (2006.01)
   *F21S 41/141*     (2018.01)
   *F21S 43/14*      (2018.01)

(58) Field of Classification Search
   USPC .......................................................... 315/77
   See application file for complete search history.

(56) References Cited

U.S. PATENT DOCUMENTS

| | | | |
|---|---|---|---|
| 5,936,986 A * | 8/1999 | Cantatore | G01N 15/14 |
| | | | 372/31 |
| 6,294,274 B1 | 9/2001 | Kawazoe et al. | |
| 6,528,951 B2 | 3/2003 | Yamazaki et al. | |
| 6,563,174 B2 | 5/2003 | Kawasaki et al. | |
| 6,693,394 B1 * | 2/2004 | Guo | H05B 33/0854 |
| | | | 315/158 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,221,338 B2 | 5/2007 | Yamazaki et al. | |
| 7,245,297 B2 | 7/2007 | Kimura et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 8,102,476 B2 | 1/2012 | Son et al. | |
| 8,487,844 B2 | 7/2013 | Koyama | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0245436 A1 * | 12/2004 | Matsumoto | H04B 10/6911 |
| | | | 250/214 C |
| 2005/0001287 A1 * | 1/2005 | Aisenbrey | H01C 7/005 |
| | | | 257/536 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0290209 A1 * | 12/2006 | Bouchard | H05B 41/2926 |
| | | | 307/137 |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163874 A1 | 7/2010 | Koyama et al. | |
| 2011/0310928 A1 * | 12/2011 | Kawamura | G01K 7/24 |
| | | | 374/185 |
| 2013/0088805 A1 * | 4/2013 | Fu | G06F 1/206 |
| | | | 361/106 |
| 2013/0193851 A1 * | 8/2013 | Alon | H03H 7/00 |
| | | | 315/121 |
| 2013/0265718 A1 * | 10/2013 | Wang | H05K 7/20209 |
| | | | 361/695 |
| 2014/0042505 A1 * | 2/2014 | Benjamin | H01L 29/78 |
| | | | 257/288 |
| 2014/0175436 A1 | 6/2014 | Yamazaki | |
| 2014/0176111 A1 * | 6/2014 | Kim | G05F 1/613 |
| | | | 323/311 |
| 2015/0223304 A1 * | 8/2015 | Li | H05B 37/02 |
| | | | 315/118 |
| 2016/0054183 A1 * | 2/2016 | Yayama | G01K 7/01 |
| | | | 374/1 |
| 2016/0190331 A1 | 6/2016 | Miyake et al. | |
| 2016/0242254 A1 * | 8/2016 | Baccarin | F21S 48/215 |
| 2016/0349904 A1 | 12/2016 | Miyake et al. | |
| 2017/0059209 A1 * | 3/2017 | Chen | F24H 9/2071 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | | | | |
|---|---|---|---|---|---|
| JP | 05-251705 | A | | 9/1993 | |
| JP | 08148727 | A | * | 6/1996 | ............ G01J 5/0245 |
| JP | 08148727 A DATE | | * | 6/1996 | ............... G01K 7/22 |
| JP | 08-264794 | A | | 10/1996 | |
| JP | 09-229778 | A | | 9/1997 | |
| JP | 11-505377 | | | 5/1999 | |
| JP | 2000-044236 | A | | 2/2000 | |
| JP | 2000-150900 | A | | 5/2000 | |
| JP | 2002-076356 | A | | 3/2002 | |
| JP | 2002-289859 | A | | 10/2002 | |
| JP | 2003-086000 | A | | 3/2003 | |
| JP | 2003-086808 | A | | 3/2003 | |
| JP | 2004-103957 | A | | 4/2004 | |
| JP | 2004-273614 | A | | 9/2004 | |
| JP | 2004-273732 | A | | 9/2004 | |
| JP | 2014-146634 | A | | 8/2014 | |
| WO | WO-2004/114391 | | | 12/2004 | |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et at., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M at al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States". SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys, Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials,.Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,Or Zn] At Temperatures Over 1000°C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13TH International Display Workshops, Dec. 7, 2006, pp. 663-666.

Lee.J et al., "World'S Largest (15-Inch) XGA AMLCD Panel Using IGZO Oxide TFT", SID Digest '08 SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom,S et al., "Theory of the Blue Phase of Cholesteric Liquid Crystals", Phys. Rev.Lett. (Physical Review Letters), May 4, 1981, vol. 46. No. 18, pp. 1216-1219.
Miyasaka.M, "Suftla Flexible Microelectronics on Their Way to Business", SID Digest '07 :SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6TH International Display Workshops, Dec. 3, 2008, pp. 581-584.
Nakamura.M et at., "The phase relations in the In2O3—Ga2ZnO4—ZnO system at 1350°C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Full Film Transistors", Jpn. J. Appl. Phys. (Japanese Journal of Applied Physics), 2006, vol. 45, No. 5B, pp. 4303-4308.
Nomura.K et at., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. 8), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 IN. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara,H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-IN. AMOLED Display With Driver Circuit Using Amorphous In—Ga—Zn-Oxide TFTS", IDW '09 : Proceedings of the 16TH International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO)TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15TH International Display Workshops, Dec. 3, 2008, pp. 1637-1640.
Tsuda.K et al., "Ultra Low Power Consumption Technologies for Mobile TFT-LCDs", IDW '02 : Proceedings of the 9TH International Display Workshops, Dec. 4, 2002, pp. 295-298.
Ueno.K et al., "Field-Effect Transistor on SrTiO3 With Sputtered Al2O3 Gate Insulator", Appl. Phys. Lett, (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 13A
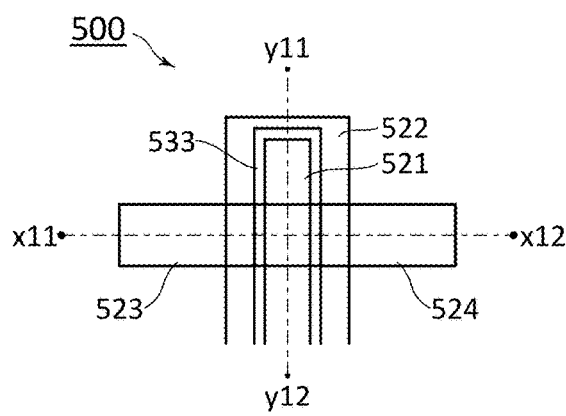
FIG. 13B
FIG. 13C
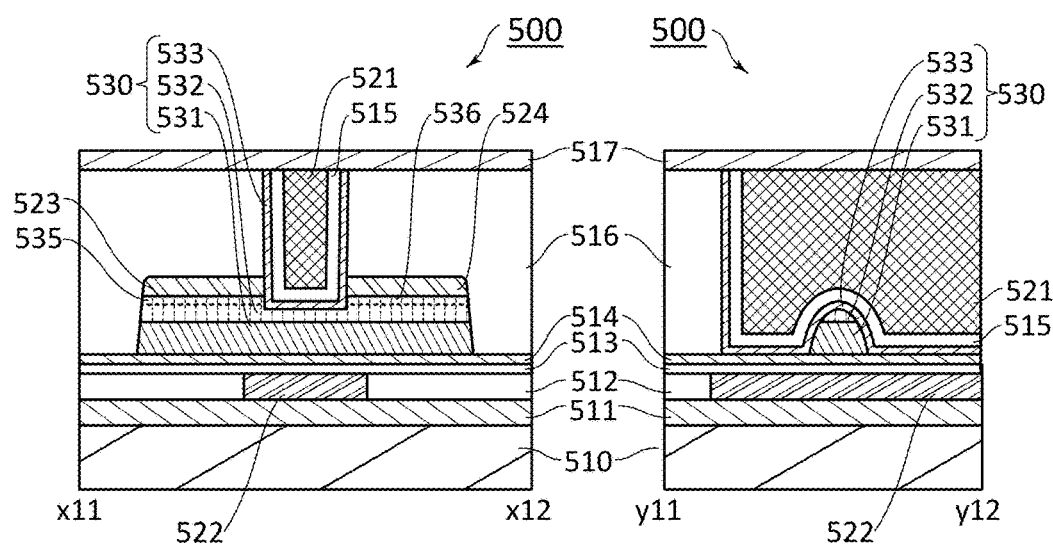

FIG. 16A
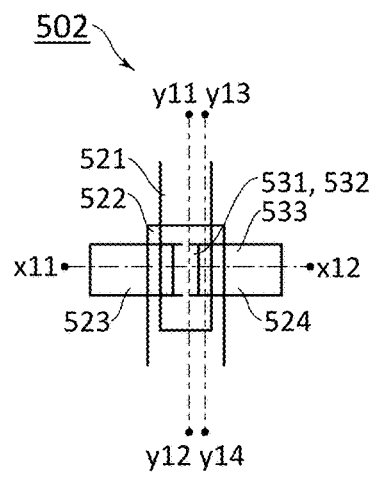
FIG. 16B
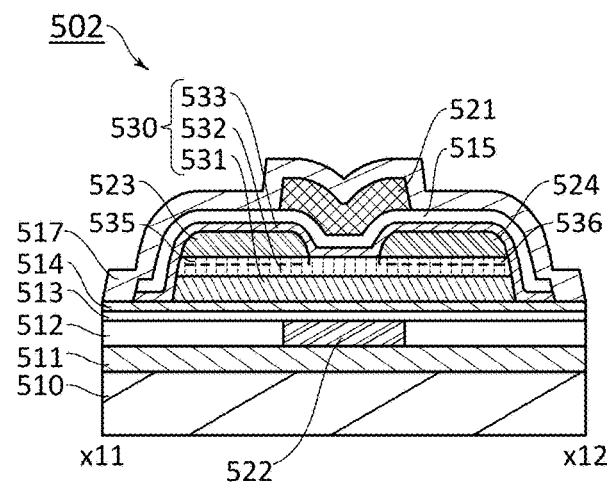
FIG. 16C
FIG. 16D
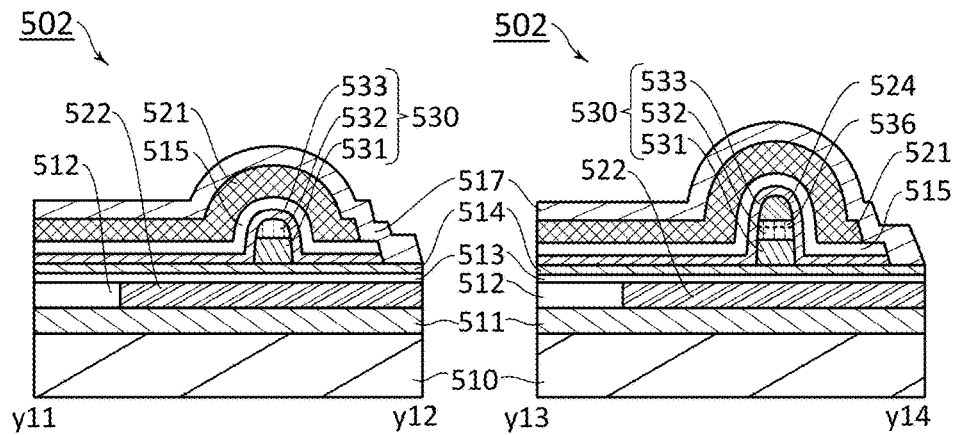

FIG. 19A out-of-plane method CAAC-OS

FIG. 19B in-plane method φ scan CAAC-OS

FIG. 19C in-plane method φ scan single crystal OS

SEMICONDUCTOR DEVICE, LIGHTING DEVICE, AND VEHICLE

BACKGROUND OF THE INVENTION

1. Field of the Invention

The invention disclosed in the specification, drawings, and scope of claims of this application (hereinafter referred to as this specification and the like) relates to a semiconductor device, an operation method thereof, a usage method thereof, a manufacturing method thereof, and the like.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Temperature sensor ICs, each of which including a temperature sensor unit and a measurement circuit unit that are integrated on a single semiconductor substrate, are known (e.g., Patent Document 1).

The temperature sensor is used in a variety of functional circuits, e.g., a light-emitting diode (LED) driver device for driving an LED. In Patent Document 2, a current output to an LED is reduced when overheating is detected by an overheat sensor.

REFERENCE

Patent Document

[Patent Document 1] Japanese Published Patent Application No. H9-229778
[Patent Document 2] Japanese Published Patent Application No. 2014-146634

SUMMARY OF THE INVENTION

In the LED driver device of Patent Document 2, the overheat sensor uses a thermistor, which is an external component of an LED driver IC (see FIG. 2 in Patent Document 2). The external component prevents a reduction in the size and costs of the LED driver device.

Thus, an object of one embodiment of the present invention is to reduce size, costs, or number of components. Another object of one embodiment of the present invention is to provide a novel semiconductor device, a driving method of the novel semiconductor device, or a manufacturing method of the novel semiconductor device.

The description of a plurality of objects does not disturb the existence of each object. One embodiment of the present invention does not necessarily achieve all the objects listed above. Other objects will be apparent from the description of this specification and the like, and such objects could be objects of one embodiment of the present invention.

One embodiment of the present invention is a semiconductor device including a first resistor and a second resistor. The first resistor and the second resistor are electrically connected in series. A resistance material of the first resistor includes a metal oxide, and a resistance material of the second resistor is different from the resistance material of the first resistor. The semiconductor device of this embodiment can be configured to output a voltage corresponding to the resistance values of the first resistor and the second resistor. The voltage reflects the properties of the resistance materials of the first resistor and the second resistor.

One embodiment of the present invention includes a first circuit and a second circuit. The first circuit includes a first resistor and a second resistor. A first terminal of the first resistor is electrically connected to a first terminal of the second resistor. A resistance material of the first resistor includes a metal oxide, and a resistance material of the second resistor is different from the resistance material of the first resistor. The second circuit is configured to process a voltage output from the first terminal of the first resistor and generate a signal. In this embodiment, the first resistor may be stacked over the second circuit.

One embodiment of the present invention is a lighting device including the semiconductor device according to any one of the above embodiments, and a light-emitting element. Another embodiment of the present invention is a vehicle including the semiconductor device according to any one of the above embodiments, and a car body.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

In this specification and the like, ordinal numbers such as "first", "second", and "third" are used to avoid confusion among components, and the terms do not limit the components numerically or do not limit the order. Other matters regarding this specification and the like will be described in Embodiment 4.

According to one embodiment of the present invention, size, costs, or number of components can be reduced. According to another embodiment of the present invention, a novel semiconductor device, a driving method of the novel semiconductor device, or a manufacturing method of the novel semiconductor device can be provided.

Note that the description of the plurality of effects does not preclude the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

In the accompanying drawings.

FIG. 13A is a top view showing a structure example of a transistor, FIG. 13B is a cross-sectional view along line x11-x12 of FIG. 13A, and FIG. 13C is a cross-sectional view along line y11-y12 of FIG. 13A;

FIG. 16A is a top view showing a structure example of a transistor, FIG. 16B is a cross-sectional view along line x11-x12 of FIG. 16A, FIG. 16C is a cross-sectional view along line y11-y12 of FIG. 16A, and FIG. 16D is a cross-sectional view along line y13-y14 of FIG. 16A;

FIGS. 19A to 19C show structural analysis of a CAAC-OS and a single crystal oxide semiconductor by XRD.

DETAILED DESCRIPTION OF THE INVENTION

Figure 1:
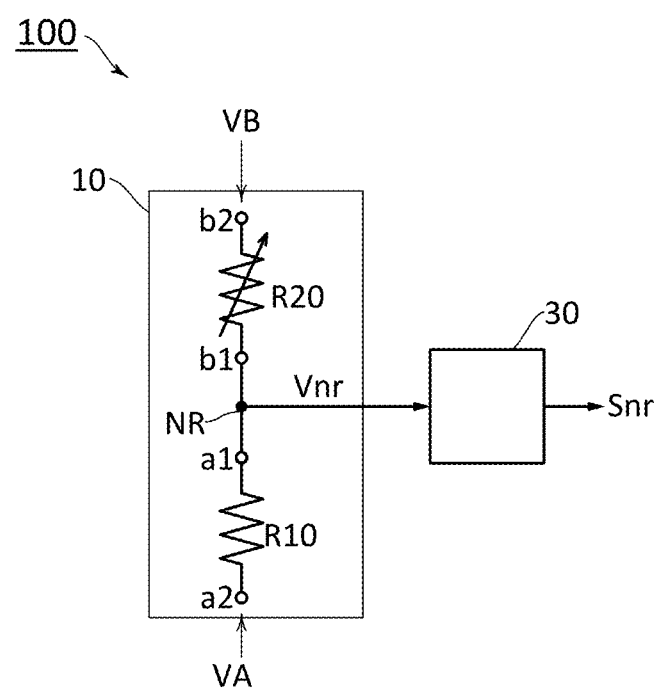
FIG. 1 is a circuit diagram showing a configuration example of a circuit.

Embodiments of the present invention are described below, and any of the embodiments can be combined as appropriate. In addition, in the case where one embodiment includes some structure examples (including method example, operating method examples, manufacturing method examples, and the like), any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the same elements, elements having similar functions, elements formed of the same material, elements formed at the same time, and the like are sometimes denoted by the same reference numerals, and the description thereof is not repeated in some cases.

Embodiment 1

In this embodiment, a circuit and the like used for sensors and sensing techniques will be described as an example of a semiconductor device.

Circuit Configuration Example 1

A circuit 100 shown in FIG. 1 includes a circuit 10 and a circuit 30. Here, the circuit 10 functions as a sensor. The circuit 10 is configured to convert a sensed object (e.g., temperature, light, or force) into an electric signal. The circuit 30 processes the electric signal generated in the circuit 10 and generates a signal Snr. The signal Snr controls other semiconductor devices.

The circuit 10 includes two resistors R10 and R20. The resistors R10 and R20 are electrically connected in series, thereby forming a divider circuit. Here, the two terminals of the resistor R10 are referred to as terminals a1 and a2, and the two terminals of the resistor R20 are referred to as terminals b1 and b2. The terminal a1 is electrically connected to the terminal b1 at a connection part referred to as a node NR. A voltage VA is input to the terminal a2, and a voltage VB is input to the terminal b2. A voltage Vnr of the node NR is determined by the voltage between the terminals a2 and b2 (|VA−VB|) and the resistance values of the resistors R10 and R20.

Here, the resistance value of the resistor R20 is likely to change with a change of a sensed object, whereas the resistance value of the resistor R10 is unlikely to change with a change of the sensed object. In other words, the amount of change in the resistance value of the resistor R10 with a change of the sensed object is smaller than that of the resistor R20.

Hence, the voltage Vnr varies with a change of the sensed object. The circuit 30 processes the voltage Vnr to generate the signal Snr. For example, the circuit 30 includes an amplifier circuit to amplify the voltage Vnr. Alternatively, the circuit 30 includes an analog-digital converter or a comparator to convert the voltage Vnr into a digital signal.

For example, in the case where the circuit 10 is used as a temperature sensor, a component whose resistance is likely to change with temperature is used as the resistor R20, and a component whose resistance is unlikely to change with temperature is used as the resistor R10.

For example, a thermistor, a resistance thermometer, or a thermocouple can be used as the resistor R20. In the case where such a component is used, a mode of the resistor R20 is an external electronic component of an IC chip (IC package) in which the circuit 30 is integrated.

Furthermore, the static characteristics of a semiconductor device containing a Group 14 element (Si, Ge, silicon carbide, or silicon germanium) have temperature dependence. By utilizing this property, the resistor R20 can be formed in a die (also referred to as a semiconductor die, a silicon die, or the like) in which the circuit 30 is formed. In that case, a diode, a transistor, a diode-connected transistor, or a resistor including an n-type or p-type diffusion region as a resistive element is used as the resistor R20. The resistor R10 may be provided as an external component of the circuit 30 or may be provided in the die of the circuit 30.

The static characteristics of a component containing a metal oxide have a low temperature dependence. Examples of the component that can be used as the resistor R10 include a resistor containing a metal oxide as a resistance material, a transistor containing a metal oxide in a semiconductor region (hereinafter also referred to as an OS transistor or an oxide semiconductor transistor), and a diode-connected OS transistor. Because these components can be fabricated through a semiconductor manufacturing process, the resistor R10 can be provided in the die of the circuit 30. This results in a reduction in the size and costs of the circuit 100. Furthermore, the resistor R10 can be stacked over the circuit 30; thus, the area overhead of the circuit 30 due to the integration of the resistor R10 in the circuit 30 can be reduced to zero.

A metal oxide used for the resistor R10 preferably contains at least one of indium (In) and zinc (Zn). Typical examples of such a metal oxide include an In oxide, a Zn oxide, an In—Zn oxide, and an In-M-Zn oxide (element M is Al, Ti, Ga, Y, Zr, La, Ce, Nd, or Hf). By reducing impurities serving as electron donors, such as moisture or hydrogen, and reducing oxygen vacancies in the metal oxide, the metal oxide can be, or extremely close to an i-type (intrinsic) semiconductor. Here, such a metal oxide can be referred to as a highly purified oxide semiconductor. By using a highly purified oxide semiconductor for a transistor, the off-state current of the OS transistor which is normalized by the channel width can be as low as several yoctoamperes per micrometer to several zeptoamperes per micrometer.

In contrast, by increasing the carrier density in the metal oxide, an n-type oxide semiconductor can be obtained. The n-type oxide semiconductor can also be referred to as an oxide conductor (OC). The resistivity of the oxide conductor has a low temperature dependence, and thus the oxide conductor is preferably used as a resistance material of the resistor R10. The oxide conductor layer of the resistor R10 and the oxide semiconductor layer of the OS transistor can be formed using the same metal oxide film; hence, the resistor R10 can be fabricated through the manufacturing process of the OS transistor.

When the resistor R20 as well as the circuit 30 and the resistor R10 is formed in a die, the circuit 100 can be further reduced in size. When the circuit 30 and the resistor R20 are provided as different electronic components, the circuit 30 can be provided with little limitation. Moreover, the resistor R20 can be easily provided near an object whose temperature is to be measured. Thus, the mode of the circuit 10 can be selected in accordance with the intended use.

Circuit Configuration Example 2

While the voltage VA is input to the terminal a2 and the voltage VB is input to the terminal b2, current flows through the resistors R10 and R20 in the circuit 10, i.e., the circuit 10 consumes power. Therefore, the voltage VA or VB may be input only when the circuit 10 needs to perform sensing operation. FIGS. 2A to 2D show such examples.

Figure 2A:
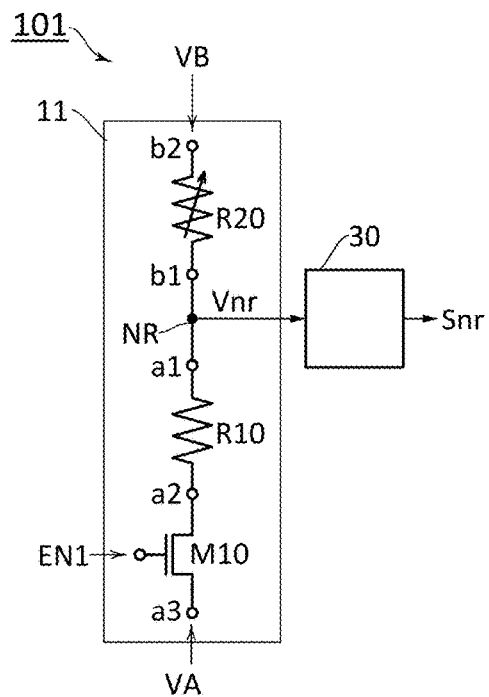
FIGS. 2A to 2D are circuit diagrams each showing a configuration example of a circuit.

A circuit 101 shown in FIG. 2A includes a circuit 11 and a circuit 30. The circuit 11 is different from the circuit 10 in including a transistor M10. The transistor M10 is a power switch for controlling the supply of the voltage VA to the terminal a2. Specifically, the transistor M10 controls the conduction between the terminal a2 and a terminal a3. The voltage VA is input to the terminal a3. The on/off of the transistor M10 is controlled by a signal EN1. The signal EN1 may be generated in the circuit 30. The transistor M10 is on in a period during which the circuit 11 needs to perform sensing operation, and the transistor M10 is off in the other period.

Figure 2B:
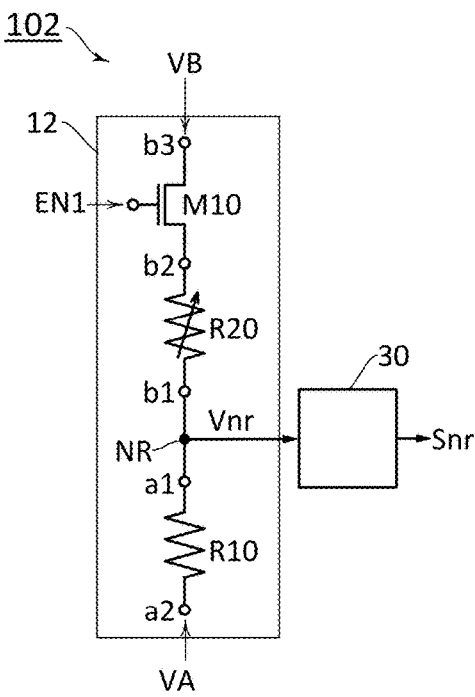

A circuit 102 shown in FIG. 2B includes a circuit 12 and the circuit 30. The circuit 12 is a modification example of the circuit 11. The transistor M10 in the circuit 12 is a power switch for controlling the supply of the voltage VB to the terminal b2. Specifically, the transistor M10 is configured to control the conduction between the terminal b2 and a terminal b3. The voltage VB is input to the terminal b3.

The transistor M10 in the circuit 11 is an n-type transistor, though it may be a p-type transistor. There is no particular limitation on the device structure of the transistor M10. The transistor M10 includes a single element semiconductor (e.g., Si, Ge, or C), a compound semiconductor (e.g., metal oxide, gallium oxide, silicon carbide, or silicon germanium), or the like. For example, in the case where the transistor M10 is an n-type transistor, the use of the OS transistor allows the area overhead of the circuit 101 due to the provision of the transistor M10 to be reduced to zero. This is because the transistor M10 and the resistor R10 can be stacked over the circuit 30 and therefore the area of the die of the circuit 30 is not increased even when the transistor M10 and the resistor R10 are added to the die of the circuit 30.

The same applies to the circuit 12 and the circuit 102.

Figure 2C:
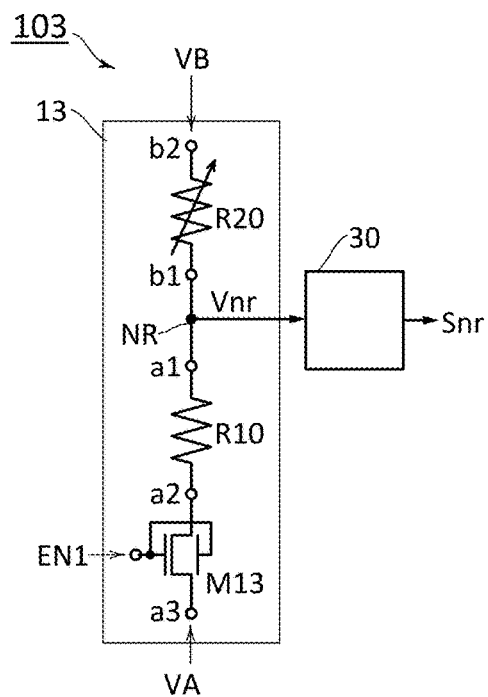
Figure 2D:
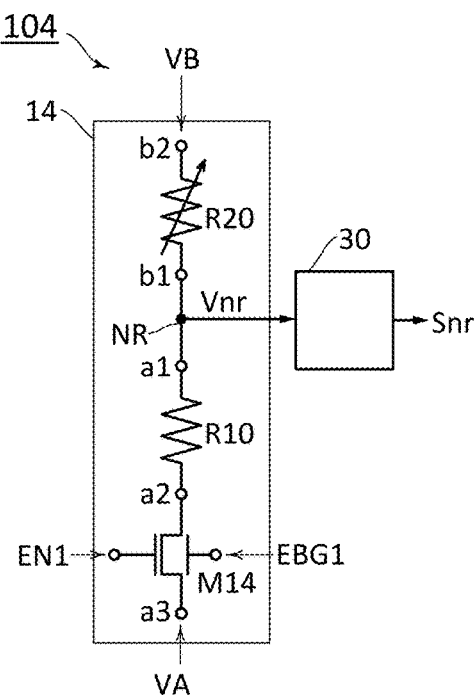

In the case where the transistor M10 is an OS transistor, the transistor can have a back gate. FIGS. 2C and 2D show such examples.

A circuit 103 shown in FIG. 2C includes a circuit 13 and the circuit 30. The circuit 13 is a modification example of the circuit 11 and includes a transistor M13 instead of the transistor M10. A back gate of the transistor M13 is electrically connected to its gate. That is, the same signal is input to the gate and the back gate of the transistor M13; hence, a high-level voltage is applied to the back gate when the transistor M13 is on, increasing the on-state current of the transistor M13. Note that the back gate of the transistor M13 may be electrically connected to a source or a drain thereof.

A circuit 104 shown in FIG. 2D includes a circuit 14 and the circuit 30. The circuit 14 is a modification example of the circuit 11 and includes a transistor M14 instead of the transistor M10. A signal EBG1 is input to a back gate of the transistor M14. The signal EBG1 may be generated in the circuit 30. The gate voltage and the back gate voltage of the transistor M14 are controlled independently. For example, a negative voltage is input to the back gate by the signal EBG1 regardless of the conduction state of the transistor M14. This allows the threshold voltage of the transistor M14 to be shifted in the positive voltage side, so that the high-level voltage of the signal EN1 can be reduced.

The aforementioned circuit 100 can be incorporated in a variety of semiconductor devices. Some examples of the semiconductor device including the circuit 10 serving as a temperature sensor are as follows. For example, the circuit 100 can be incorporated in a dynamic random access memory (DRAM) module, so that the refresh interval of the DRAM can be controlled in accordance with the signal Snr of the circuit 30. Alternatively, the circuit 100 can be incorporated in a housing of an electronic device, so that the temperature inside the housing can be monitored. In the case where the housing overheats, the signal Snr of the circuit 30 enables a protection circuit to operate so that an electronic component is protected from overheating. The same applies to the circuits 101 to 104. As an example of the semiconductor device including a temperature sensor, a semiconductor device configured to drive an LED will be described below.

Figure 3:
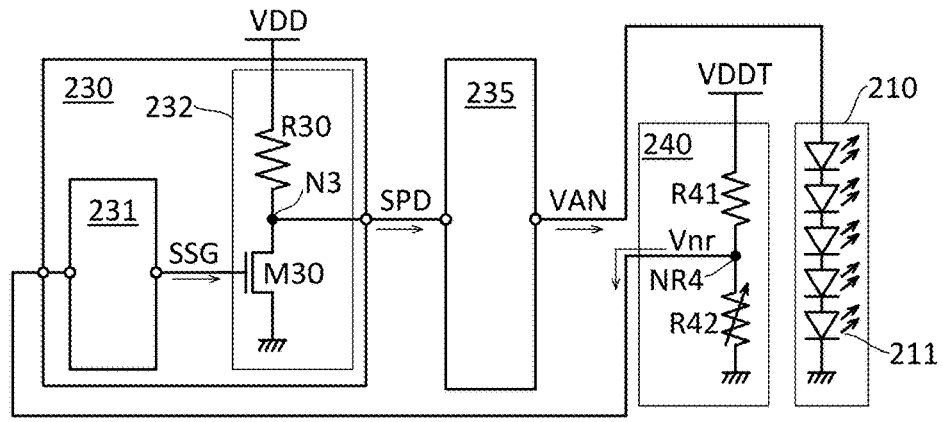
FIG. 3 is a block diagram showing a configuration example of a semiconductor device.

A lighting device 200 shown in FIG. 3 includes a light-emitting unit 210 and a semiconductor device 220. The light-emitting unit 210 includes at least one LED 211. The semiconductor device 220 includes a circuit 230, a voltage generation circuit 235, and a temperature sensor 240. The LED 211 is used here as a light-emitting element in the light-emitting unit 210, though another light-emitting element may be used.

The semiconductor device 220 is a device for turning on the light-emitting unit 210. The semiconductor device 220 is configured to supply a voltage VAN for lighting the LED 211 to the light-emitting unit 210. The voltage VAN adjusts the luminance and color temperature of the light-emitting unit 210. In other words, the semiconductor device 220 is configured to drive the light-emitting unit 210 and can also be referred to as a driver circuit (here, an LED driver circuit).

The voltage generation circuit 235 is configured to generate the voltage VAN. Because the voltage VAN is a direct-current voltage, the voltage generation circuit 235 includes, for example, a switching regulator.

The circuit 230 is configured to drive the voltage generation circuit 235 and can also be referred to as a pre-driver circuit. The circuit 230 generates a signal SPD for driving the voltage generation circuit 235. The voltage generation circuit 235 is configured to change the voltage VAN in accordance with the signal SPD.

The circuit 230 includes a circuit 231 and an output unit 232. The output unit 232 includes a node N3, a resistor R30, and a transistor M30. A voltage VDD is input to a first terminal of the resistor R30, and a second terminal of the resistor R30 is electrically connected to the node N3. A ground potential is input to a first terminal of the transistor M30, and a second terminal of the transistor M30 is electrically connected to the node N3. The node N3 is electrically connected to a terminal of the circuit 230 from which the signal SPD is output.

The circuit 231 is configured to generate a signal SSG. The signal SSG controls the conduction state of the transistor M30, and is input to a gate of the transistor M30. The circuit 231 generates the signal SSG in accordance with the voltage Vnr input from the temperature sensor 240.

A voltage VDDT and the ground potential are input to the temperature sensor 240. The temperature sensor 240 includes a node NR4, a resistor R41, and a resistor R42. The temperature sensor 240 has a circuit configuration similar to that of the circuit 10 (FIG. 1), and the node NR4, the resistor R41, and the resistor R42 correspond to the node NR, the resistor R10, and the resistor R20, respectively. It is needless to say that any of the circuits 11 to 14 (FIGS. 2A to 2D) can be applied to the temperature sensor 240.

The level of the voltage Vnr depends on the temperature sensed by the temperature sensor 240. The signal SSG varies with the voltage Vnr, whereby the voltage VAN can be changed in accordance with the temperature sensed by the temperature sensor 240.

In general, an LED forward voltage needed to flow a constant current decreases as the temperature rises. Also, the LED generates heat when emitting light. Hence, when the LED is driven at a constant voltage, the temperature of the LED rises and the amount of current flowing through the LED increases, which causes degradation of the LED due to heat. In the semiconductor device 220, degradation of the LED 211 can be suppressed because the voltage VAN input to the LED 211 is adjusted by the voltage Vnr output from the temperature sensor 240.

The circuit 230 may also be configured to generate the signal SSG in accordance with a signal input from the outside of the semiconductor device 220. The semiconductor device 220 may also include another sensor such as an optical sensor. In that case, the circuit 230 may be configured to, for example, generate the signal SSG in accordance with the output of each sensor. Specifically, the optical sensor allows the semiconductor device 220 to have a function of adjusting the brightness of the light-emitting unit 210 in accordance with the surrounding brightness.

(Configuration Example of the Output Unit 232)

The transistor M30 in the output unit 232 and the circuit 231 may be fabricated in the same die, or alternatively, the transistor M30 may be provided as an external electronic component of the circuit 230. In the case where the light-emitting unit 210 is driven at a high voltage, a high voltage is input to the node N3. Therefore, the transistor M30 is preferably a transistor with a high upper limit of a source-drain voltage, a gate-source voltage, and a gate-drain voltage (i.e., a high withstand voltage). An OS transistor has a high withstand voltage. A semiconductor containing a metal oxide (an oxide semiconductor) has a large effective mass of holes and electrons are less likely to be excited; accordingly, avalanche breakdown or the like is less likely to occur in an OS transistor than in a general transistor including silicon or the like. Because hot-carrier degradation or the like due to the avalanche breakdown is inhibited, the OS transistor has a high drain withstand voltage and can be driven at high source-drain voltage. Hence, the OS transistor is suitable for the transistor M30. When the OS transistor is used as the transistor M30, the transistor M30 can be stacked over the die of the circuit 231, resulting in the downsizing of the circuit 230.

There is no particular limitation on the resistor R30. For example, like the resistor R41, the resistor R30 can include a metal oxide as a resistance material. In that case, the resistors R30 and R41 can be stacked over the die of the circuit 231, resulting in the downsizing of the circuit 230. The resistor R30 can also include a transistor. In that case, by using an OS transistor for the resistor R30, the resistors R30 and R41 can be stacked over the die of the circuit 231, resulting in the downsizing of the circuit 230.

FIGS. 4A to 4E show examples of a circuit that can be used for the output unit 232 and includes an OS transistor. A circuit 251 shown in FIG. 4A includes the node N3, the resistor R30, and a transistor M51. The transistor M51 is an OS transistor and corresponds to the transistor M30. The transistor M51 includes a back gate electrically connected to a gate of the transistor M51.

Figure 4A:
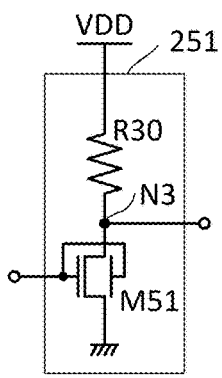
FIGS. 4A to 4E are circuit diagrams each showing a configuration example of a circuit in an output unit of FIG. 3.
Figure 4B:
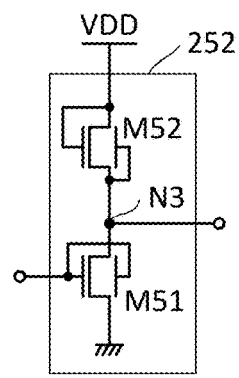

A circuit 252 shown in FIG. 4B is a modification example of the circuit 251, and includes a transistor M52 as the resistor R30. The transistor M52 is an OS transistor whose gate is electrically connected to a drain thereof and whose back gate is electrically connected to the node N3 (a source of the transistor M52). Note that a signal generated in an external circuit of the semiconductor device 220 or a signal generated in the circuit 230 may be input to the back gate of the transistor M52. Alternatively, the transistor M52 may be a transistor without a back gate.

Figure 4C:
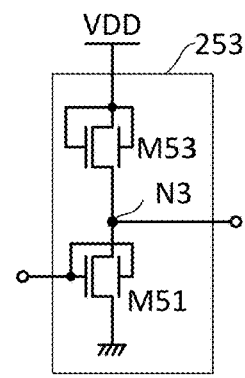

A circuit 253 shown in FIG. 4C is a modification example of the circuit 252, and includes a transistor M53 instead of the transistor M52. A back gate of the transistor M53 is electrically connected to a node to which VDD is input (a drain of the transistor M53). That is, the back gate of the transistor M53 is electrically connected to the node with the highest voltage in the circuit 253; as a result, the on-current characteristics of the transistor M53 can be effectively improved.

Figure 4D:
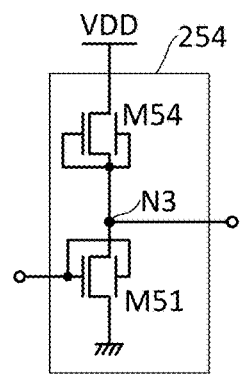

A circuit 254 shown in FIG. 4D is a modification example of the circuit 251, and includes a transistor M54 as the resistor R30. The transistor M54 is an OS transistor whose gate is electrically connected to the node N3 (a source of the transistor M54) and whose back gate is also electrically connected to the node N3. Note that a signal generated in an external circuit of the semiconductor device 220 or a signal generated in the circuit 230 may be input to the back gate of the transistor M54. Alternatively, the transistor M54 may be a transistor without a back gate.

Figure 4E:
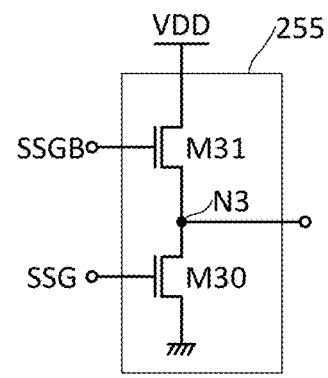

A circuit 255 shown in FIG. 4E includes the transistor M30, a transistor M31, and the node N3. The transistors M30 and M31 are OS transistors. The transistor M31 corresponds to the resistor R30. A signal SSGB, which is an inverted signal of the signal SSG, is input to a gate of the transistor M31. Hence, in the circuit 255, the conduction states of the transistors M30 and M31 are changed complementarily. Note that the transistor M31 may include a back gate to which a signal generated in an external circuit of the semiconductor device 220 or a signal generated in the circuit 230 is input. The same applies to the transistor M30.

In the semiconductor device 220, the OS transistor can be applied not only to the output unit 232 but also to, for example, an inverter circuit. An inverter circuit including an OS transistor will be described with reference to FIGS. 5A to 5D.

Figure 5A:
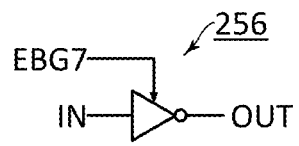
FIGS. 5A and 5B are circuit diagrams showing a configuration example of an inverter circuit (INV), FIG. 5C schematically shows the $I_d$-$V_{gs}$ characteristics of transistors included in the INV of FIG. 5B.
Figure 5B:
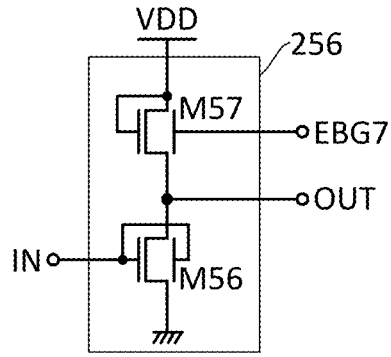

An inverter circuit (INV) 256 shown in FIG. 5A is configured to generate a signal obtained by inverting a signal of a terminal IN and output the inverted signal from a terminal OUT. A signal EBG7 is a control signal of the INV 256. FIG. 5B shows an example of a specific circuit configuration of the INV 256.

As shown in FIG. 5B, the INV 256 includes a transistor M56 and a transistor M57. The transistors M56 and M57 are each an OS transistor provided with a back gate. Here, the high power source voltage and the low power source voltage of the INV 256 are VDD and GND, respectively.

A gate of the transistor M56 is electrically connected to the terminal IN, a first terminal thereof is electrically connected to a GND input terminal, and a second terminal thereof is electrically connected to the terminal OUT and a first terminal of the transistor M57. A back gate of the transistor M56 is electrically connected to the gate thereof. A gate and a second terminal of the transistor M57 are electrically connected to a VDD input terminal, and the signal EBG7 is input to a back gate of the transistor M57. That is, the transistors M56 and M57 are electrically connected in series between the VDD input terminal and the GND input terminal. In the example of FIG. 5B, a voltage applied to the back gate of the transistor M57 (a back gate bias) is changed by the signal EBG7. Accordingly, the threshold voltage of the transistor M57 (hereinafter also referred to as "VT57") can be changed with the operation of the INV 256.

Figure 5C:
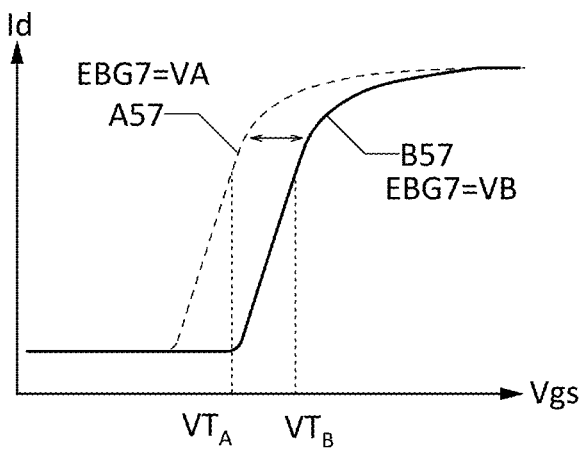
FIG. 5D is a timing chart showing an operation example of the INV of FIG. 5B.

FIG. 5C is a schematic diagram showing the static electrical properties of the transistor M57. FIG. 5C shows a drain current versus gate-source voltage curve ($I_d$-$V_{gs}$ curve) of the transistor M57. A dotted-line curve A57 is an $I_d$-$V_{gs}$ curve with a voltage of the signal EBG7=VA. A solid-line curve B57 is an $I_d$-$V_{gs}$ curve with a voltage of the signal EBG7=VB. VB is a voltage lower than VA. Preferably, VB is a positive voltage and VA is a negative voltage.

In order to improve the on-current characteristics of the transistor M57, VB is preferably a positive voltage because the transistor M57 is an n-type transistor. When VA is input to the back gate of the transistor M57, VT57 is shifted in the negative voltage side, whereas when VB is input to the back gate of the transistor M57, VT57 is shifted in the positive voltage side. $VT_A$ is a threshold voltage of the transistor M57 with a back gate bias of VA, and $VT_B$ is a threshold voltage of the transistor M57 with a back gate bias of VB.

When VT57 is shifted in the positive voltage side, a drain current is unlikely to flow through the transistor M57, whereas when VT57 is shifted in the negative voltage side, a drain current is likely to flow through the transistor M57. This can be found by the comparison of the curve A57 and the curve B57 in FIG. 5C. With $V_{gs}$ kept constant, $I_d$ of the transistor M57 with a back gate bias of VA is larger than that of the transistor M57 with a back gate bias of VB. By utilizing a change in the static electrical properties of the transistor M57 with the back gate bias, improved reliability and reduced power consumption of the INV 256 can be achieved.

Figure 5D:
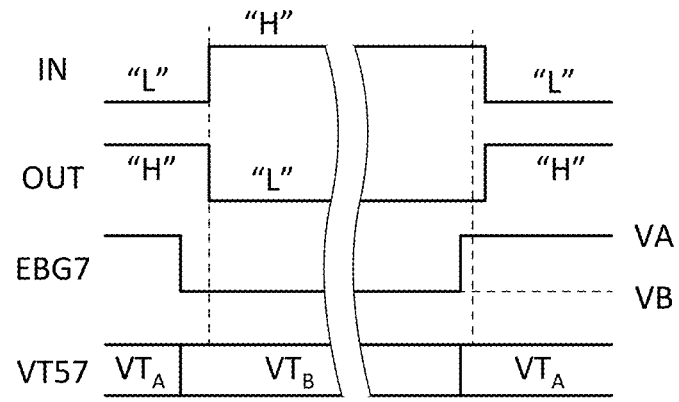

FIG. 5D is a timing chart showing an operation example of the INV 256. FIG. 5D also shows a change in the threshold voltage VT57. The terminal OUT is "H" when the terminal IN is "L", whereas the terminal OUT is "L" when the terminal IN is "H".

When the voltage of the signal EBG7 is VB, a drain current is unlikely to flow through the transistor M57. Accordingly, the voltage of the terminal OUT falls steeply when the transistor M56 is turned on (when the terminal IN is changed from "L" to "H"). In addition, a shoot-through current between the VDD input terminal and the GND input terminal can be reduced, leading to lower dynamic power consumption.

When the voltage of the signal EBG7 is VA, a drain current is likely to flow through the transistor M57, i.e., the on-current characteristics of the transistor M57 are improved. The voltage of the terminal OUT rises steeply when the transistor M56 is turned off (when the terminal IN is changed from "H" to "L").

A reduction in the number of electronic components of the semiconductor device 220 reduces the size of the lighting device 200. Furthermore, the number of assembly steps of the semiconductor device 220 can be reduced, resulting in lower costs of the semiconductor device 220 and the lighting device 200. For example, the number of electronic components of the semiconductor device 220 can be reduced when components of another circuit are provided in the die of the circuit 231.

<<Device Structure of the Circuit 230>>

Figure 6A:
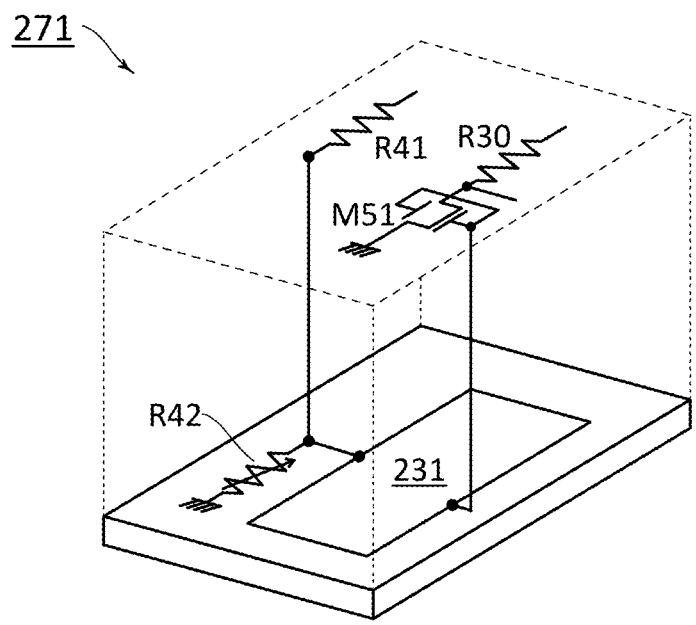
FIGS. 6A and 6B are schematic diagrams each showing a structure example of a die.

FIG. 6A shows a schematic diagram of a die. In FIG. 6A, the circuit 251 is used for the output unit 232 in the circuit 230 as an example. A die 271 shown in FIG. 6A includes the circuit 230 (the circuit 231, the resistor R30, and the transistor M51) and the temperature sensor 240 (the resistors R41 and R42). The resistor R42 is fabricated through the manufacturing process of the transistors in the circuit 231. Because the transistor M51 and the resistor R30 are formed using a metal oxide, they can be stacked over the circuit 231 along with the resistor R41. That is, the die 271 has a structure in which the resistors R30 and R41 and the transistor M51 are stacked over a region including the resistor R42 and the circuit 231. When the die 271 is placed in a package, an electronic component is obtained.

In FIG. 6A, the transistor M52 or M53 may be provided instead of the resistor R30. In FIG. 6A, the resistor R42 is not necessarily provided in the die 271. Either or both of the resistor R30 and the transistor M51 can be provided outside the die 271.

Figure 6B:
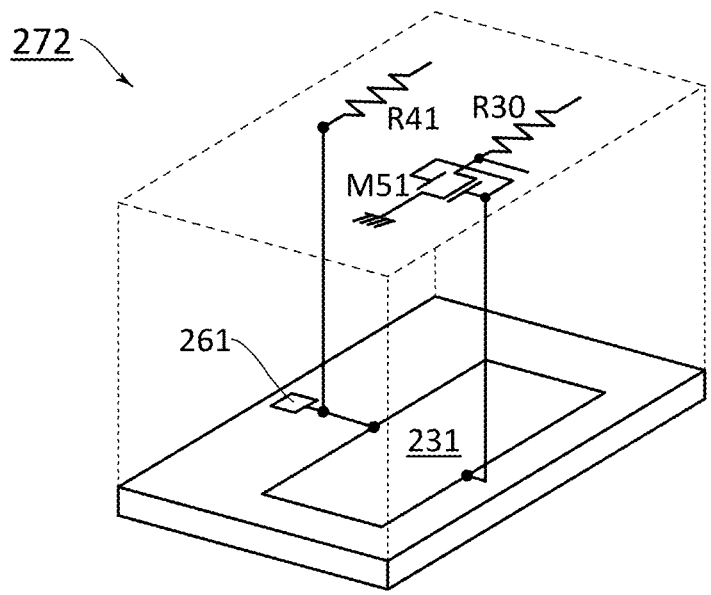

In FIG. 6B, the resistor R42 is provided as an external component of the circuit 230 as an example. In that case, the resistor R42 is not provided in a die 272 of the circuit 230 and a terminal 261 for connecting the resistor R42 is provided. Instead of the resistor R30, the transistor M52 or M53 may be provided in the die 272.

Figure 7:
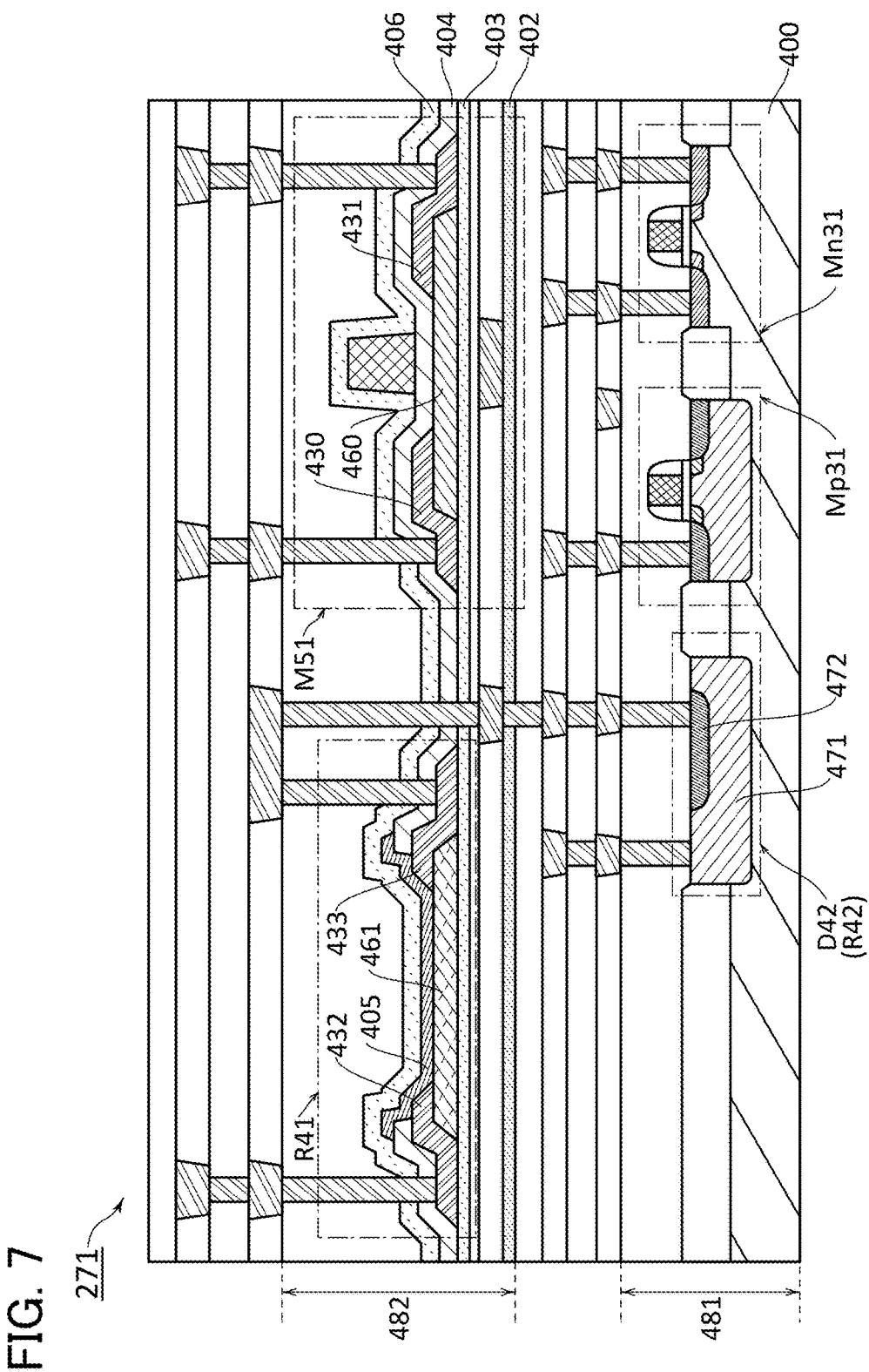
FIG. 7 is a cross-sectional view showing a structure example of a die.

The structure of the die 271 will be described with reference to FIG. 7. FIG. 7 is not a cross-sectional view of the die 271 taken along a specific line but a diagram for illustrating a layered structure of the die 271.

Insulators, conductors, semiconductors, and the like included in the die 271 are typically formed by a sputtering method or a plasma chemical vapor deposition (CVD) method. Another method such as a thermal CVD method can also be used. As the thermal CVD method, for example, a metal organic chemical vapor deposition (MOCVD) method or an atomic layer deposition (ALD) method can be used.

In FIG. 7, layers 401 to 406 are insulating layers. In FIG. 7, regions where reference numerals and hatching patterns are not given show regions formed of an insulator. For these regions, an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, a resin such as a polyimide resin, a polyamide resin, an acrylic resin, a siloxane resin, an epoxy resin, or a phenol resin can be used for these regions.

In FIG. 7, regions where hatching patterns are given but reference numerals are not given show regions formed of a conductor. A region formed of a conductor has a single-layer structure or a layered structure including two or more layers. Examples of the conductive material include low-resistance metals such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy mainly containing one or more of these metals; and a compound mainly containing one or more of these metals. It is particularly preferable to use a high-melting-point material that has both heat resistance and conductivity, such as tungsten or molybdenum. A low-resistant conductive material containing aluminum, copper, or the like is also preferably used. For example, a Cu—Mn alloy is preferably used because manganese oxide formed at the interface with an insulator containing oxygen has a function of suppressing Cu diffusion.

In FIG. 7, reference numeral 400 denotes a substrate, here, a p-type single crystal silicon wafer. The substrate 400 is not limited thereto, and a substrate similar to a substrate 510 in Embodiment 3 can be used.

The die 271 includes at least two element layers 481 and 482. In the layer 481, an element using silicon such as a Si transistor is formed. FIG. 7 shows a transistor Mn31, a transistor Mp31, and a diode D42 as typical examples. The transistors Mn31 and Mp31 are included in the circuit 230. The transistor Mn31 is an n-type transistor and the transistor Mp31 is a p-type transistor. The diode D42 corresponds to the resistor R42. The diode D42 is a p-n junction diode and includes a p-type impurity region 471 and an n-type impurity region 472.

Figure 8A:
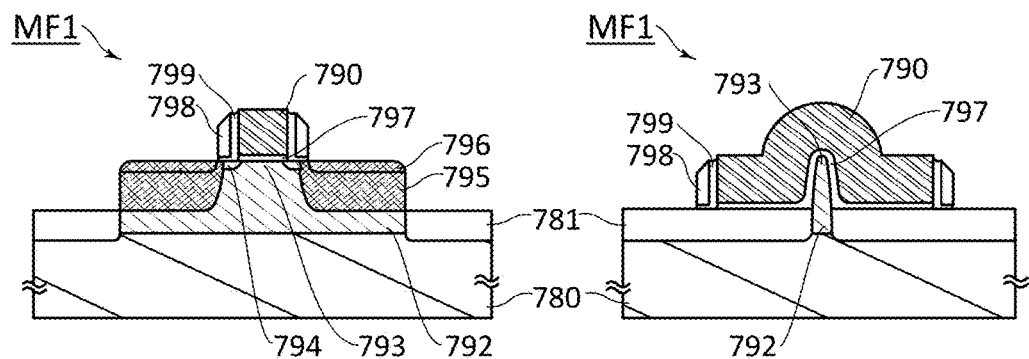
FIGS. 8A and 8B are cross-sectional views each showing a structure example of a transistor.
Figure 8B:
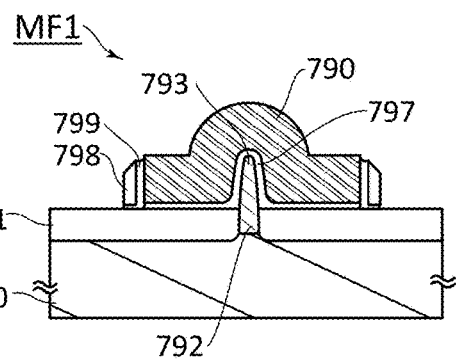

In the example of FIG. 7, the transistors Mn31 and Mp31 are planar transistors. There is no particular limitation on the device structure of the transistor formed in the element layer 481, and either a planar transistor or a FIN transistor may be employed. FIGS. 8A and 8B show structure examples of a FIN transistor. FIG. 8A is a cross-sectional view of a transistor MF1 in the channel length direction, and FIG. 8B is a cross-sectional view of the transistor MF1 in the channel width direction.

The transistor MF1 has a projection that is formed by processing part of a substrate 780. An insulating layer 781 is used for element isolation. A well 792 is provided in the projection. The well 792 includes low-concentration impurity regions 794 and high-concentration impurity regions 795 (collectively simply referred to as impurity regions), a channel formation region 793, and conductive regions 796 in contact with the impurity regions. The conductive regions 796 can be formed of a metal silicide or the like. A gate insulating layer 797 is provided over the channel formation region 793, and a gate electrode 790 is provided over the gate insulating layer 797. Sidewall insulating layers 798 and 799 are provided on side surfaces of the gate electrode 790.

The element layer 482 is stacked over the element layer 481. In the element layer 482, an element using a metal oxide such as an OS transistor or a resistor using an OC is formed. FIG. 7 shows the transistor M51 and the resistor R41.

Figure 18:
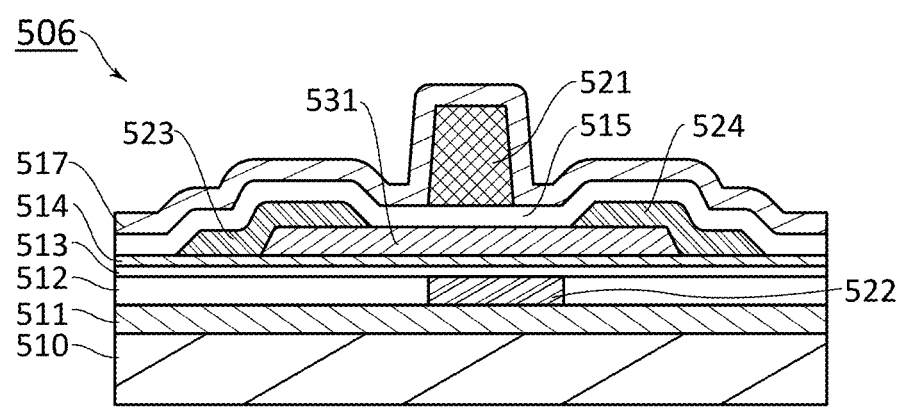
FIG. 18 is a cross-sectional view showing a structure example of a transistor.

The transistor M51 has a device structure similar to that of a transistor 506 (FIG. 18). The transistor M51 includes conductive layers 430 and 431 and an oxide semiconductor layer 460 (hereinafter referred to as an OS layer 460). A channel formation region is formed in the OS layer 460. In the OS layer 460, regions in contact with the conductive layers 430 and 431 have a lower resistance than the other region.

The resistor R41 includes an oxide conductor layer 461 (hereinafter referred to as an OC layer 461) and conductive layers 432 and 433. The OC layer 461 serves as a resistive element of the resistor R41, and the conductive layers 432 and 433 each serve as a terminal. The OS layer 460 and the OC layer 461 are formed using the same metal oxide film. The metal oxide film may be a single layer or stacked layers.

The oxide conductor can be formed by reducing the resistivity of the metal oxide in the following manner, for example: oxygen vacancies in the metal oxide are increased, the amount of impurity (typically, hydrogen, water, and the like) in the metal oxide is increased, or a rare gas element (Ar, Xe, Kr, Ne, or He) is added to the metal oxide. The resistivity of the oxide conductor can be, for example, greater than or equal to $1 \times 10^{-3}$ Ωcm and less than or equal to $1 \times 10^4$ Ωcm. Here, the OC layer 461 is formed by diffusing hydrogen from the insulating layer 405 to a metal oxide layer. The manufacturing method of the resistor R41 is as follows.

A metal oxide film is deposited and a metal oxide layer serving as the resistor R41 (hereinafter referred to as an MO layer 41 for convenience) and the OS layer 460 of the transistor M51 are formed. Then, the conductive layers 430 to 433 are formed. In the case where the OC layer 461 is formed by the addition of a rare gas element, the rare gas element may be added to the metal oxide layer serving as the resistor R41 before the formation of the conductive layers 430 to 433.

The insulating layer 404 is formed. Then, an opening is formed in a region of the insulating layer 404 in which the resistor R41 is to be formed. The insulating layer 405 is formed over the insulating layer 404. The insulating layer 405 may be formed using an insulating film from which hydrogen can be released; typically, a silicon nitride film deposited by a plasma CVD method. The deposition by the plasma CVD method allows the silicon nitride film to have a hydrogen concentration of $1\times10^{22}$ atoms/cm$^3$ or more. In the opening in the insulating layer 404, the silicon nitride film is in contact with the MO layer 41; hence, hydrogen in the silicon nitride film is diffused to the MO layer 41. Hydrogen is bonded to oxygen vacancies in the MO layer 41 to generate carriers, i.e., the resistivity of the MO layer 41 decreases, so that the OC layer 461 can be obtained.

Figure 9:
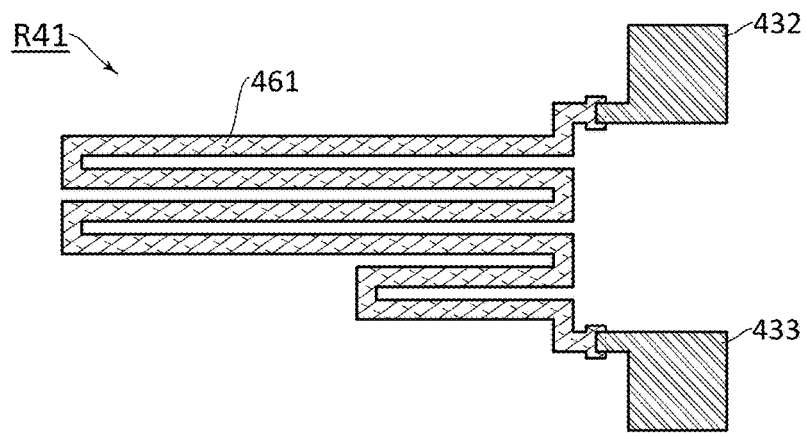
FIG. 9 is a plan view showing a structure example of a resistor.

The resistance value of the resistor R41 can be adjusted not only by the resistivity of the OC layer 461 but also by the shape, size, or the like of the OC layer 461. FIG. 9 shows an example of a planar shape of the resistor R41. The OC layer 461 in FIG. 9 has a band-like shape and includes meandering portions.

The resistor R30 may be provided in the element layer 482. The resistor R30 may have a device structure similar to that of the resistor R41. The transistor M52 (FIG. 4B) or the transistor M53 (FIG. 4C) can be provided in the element layer 482. The device structures of the transistors M52 and M53 may be similar to or different from the device structure of the transistor M51.

Figure 10A:
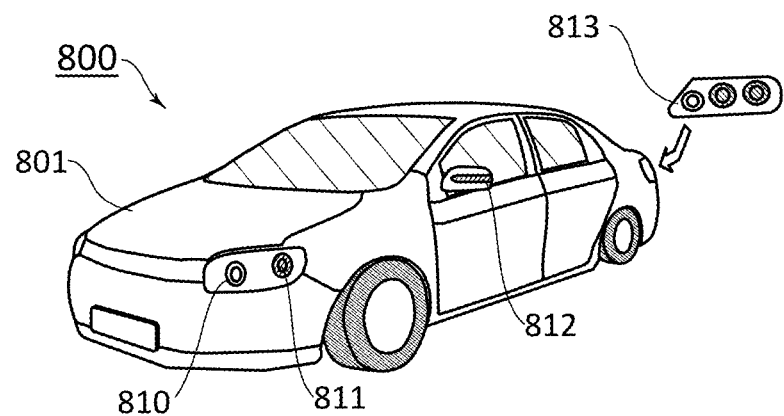
FIGS. 10A and 10B are schematic views showing structure examples of an automobile.
Figure 10B:
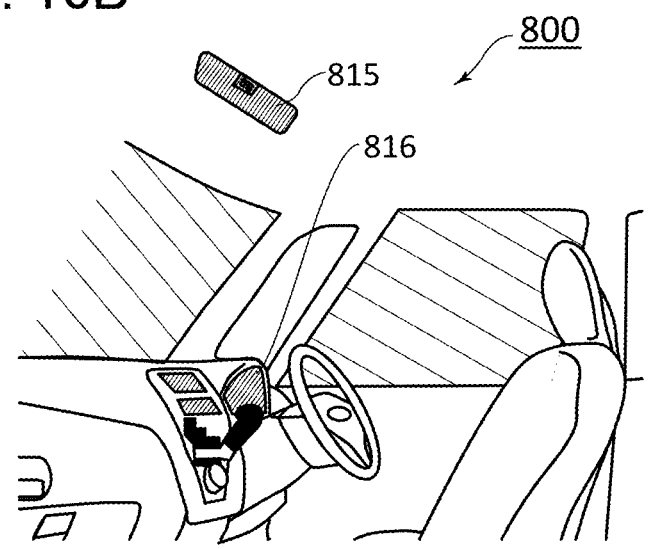

The lighting device 200 shown in FIG. 3 can be applied to lighting devices in a variety of fields, e.g., interior lighting devices (LED lamps and LED fluorescent lamps), outdoor lighting devices, backlight devices for liquid crystal display devices (LCDs), lighting devices for vehicles (automobiles, two wheels, and the like), lighting devices for rail cars, traffic lights, electronic message boards, and electronic signs. Examples of the lighting devices for vehicles include a headlight, a front combination lamp, a daytime running lamp, a rear combination lamp, an indicator, and a room lamp. FIGS. 10A and 10B show an example of an automobile (a four-wheel car) including the lighting device 200. It is needless to say that the lighting device 200 can be applied to other vehicles without limitation to that shown in FIGS. 10A and 10B.

For example, an automobile 800 shown in FIG. 10A uses the lighting device 200 for a headlight 810, indicators 811 and 812, a rear combination lamp 813, and the like. These lighting devices are attached to a car body 801. FIG. 10B shows examples of lighting devices inside the car body 801 of the automobile 800 to which the lighting device 200 can be applied. The lighting device 200 can be used for a room lamp 815, a control panel 816, and the like.

Figure 11:
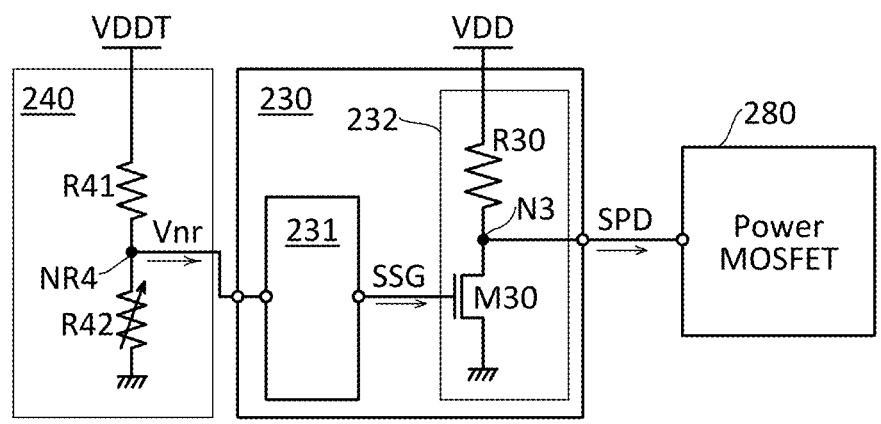
FIG. 11 is a block diagram showing a configuration example of a semiconductor device.

The application of the circuit 230 is not limited to the pre-driver circuit for the lighting device. The circuit 230 can be used as, for example, a pre-driver circuit for controlling a power MOSFET. FIG. 11 shows an example in that case. A semiconductor device 201 shown in FIG. 11 includes the circuit 230, the temperature sensor 240, and a power MOSFET 280. The power MOSFET 280 is controlled by a signal SPD generated in the circuit 230. The temperature sensor 240 allows the operation of the power MOSFET 280 based on a temperature sensed by the temperature sensor 240. The semiconductor device 201 can be used as, for example, a variety of semiconductor devices such as a control device for the automobile 800.

Embodiment 2

Figure 12A:
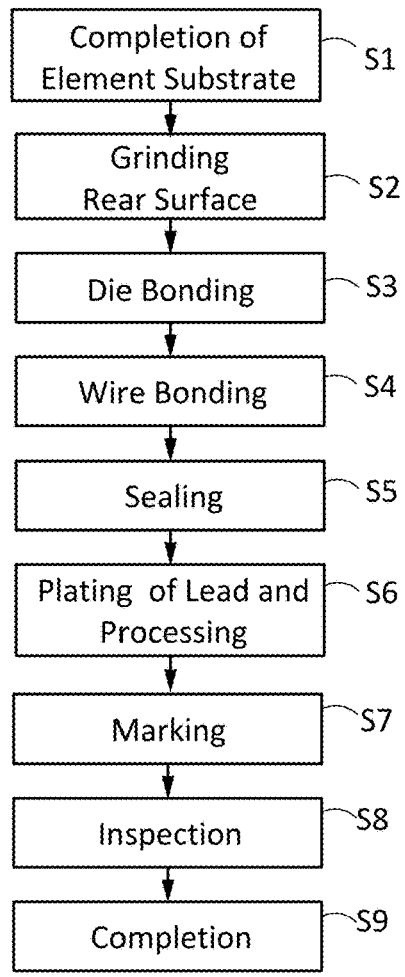
FIG. 12A is a flowchart showing an example of a manufacturing method of an electronic component.

In this embodiment, a manufacturing method, a structure, and the like of an electronic component will be described. FIG. 12A is a flow chart showing an example of a method for manufacturing an electronic component. The electronic component is also referred to as a semiconductor package or an IC package. This electronic component has a plurality of standards and names depending on a terminal extraction direction and a terminal shape. Thus, an example of the electronic component is described in this embodiment.

A semiconductor device including a transistor is completed by integrating detachable components on a printed wiring board through an assembly process (post-process). The post-process can be finished through steps shown in FIG. 12A. Specifically, an element substrate obtained in a preceding process is completed (Step S1). Any of the semiconductor devices shown in FIG. 1, FIG. 3, FIG. 11, and the like is fabricated over the element substrate.

After the element substrate is completed, a rear surface of the substrate is ground (Step S2). The substrate is thinned in this step to reduce warpage or the like of the substrate in the preceding process and to reduce the size of the component. The rear surface of the substrate is ground so that the substrate is divided into a plurality of dies in a dicing process. Then, the divided dies are separately picked up to be mounted on and bonded to a lead frame in a die bonding step (Step S3). In this die bonding step, the die is bonded to the lead frame by an appropriate method depending on a product, for example, bonding with a resin or a tape. Note that in the die bonding step, the chip may be mounted on an interposer to be bonded.

Then, wire bonding is performed to electrically connect lead of the lead frame to a terminal on the die with a metal fine line (wire) (Step S4). A silver line or a gold line can be used as the metal fine line. Ball bonding or wedge bonding can be used as the wire bonding. A molding step is performed to seal the wire bonded chip with an epoxy resin or the like (Step S5). With the molding step, the electronic component is filled with the resin, so that damage to a mounted circuit portion or wire due to mechanical external force can be reduced. Furthermore, deterioration in characteristics due to moisture or dust can be reduced. Next, the lead of the lead frame is plated. After that, the lead is cut and processed (Step S6). This plating process prevents rust of the lead and facilitates soldering at the time of mounting the chip on a printed wiring board in a later step. Next, printing (marking) is performed on a surface of the package (Step S7). Through a final inspection step (Step S8), the electronic component is completed (Step S9).

The above electronic component can include the semiconductor device described in the above embodiment. Thus, the electronic component can consume less power and have a smaller size.

Figure 12B:
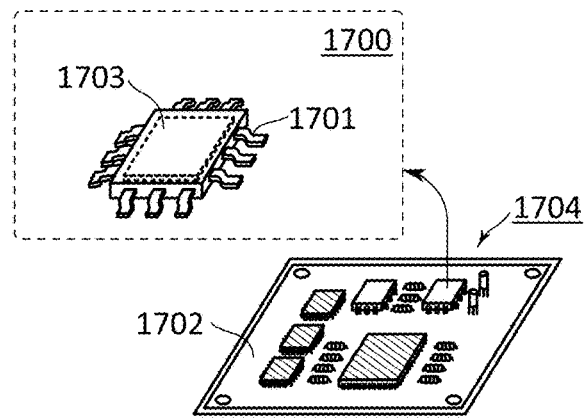
FIG. 12B is a schematic perspective view showing a structure example of the electronic component.

FIG. 12B is a schematic perspective view of the completed electronic component. FIG. 12B shows a quad flat package (QFP) as an example of the electronic component. An electronic component 1700 shown in FIG. 12B includes a lead 1701 and a circuit portion 1703. The electronic component 1700 is mounted on a printed wiring board 1702, for example. When a plurality of electronic components 1700 are used in combination and electrically connected to each other over the printed wiring board 1702, the electronic components 1700 can be mounted on an electronic device. A completed circuit board 1704 is provided in the electronic device or the like.

Embodiment 3

In this embodiment, a device structure and the like of an OS transistor will be described.

Transistor Structure Example 1

FIG. 13A is a top view of a transistor 500. FIG. 13B is a cross-sectional view along line x11-x12 in FIG. 13A, and FIG. 13C is a cross-sectional view along line y11-y12 in FIG. 13A. Note that the direction of line x11-x12 and the direction of line y11-y12 are sometimes referred to as a channel length direction and a channel width direction, respectively, of the transistor 500. For simplification of the drawing, some components are not illustrated in FIG. 13A. The same applies to FIG. 15A.

The transistor 500 is formed over a substrate 510. The transistor 500 includes insulating layers 511 to 517, conductive layers 521 to 524, and metal oxide layers 531 to 533. Each of these layers may have a single-layer structure or a layered structure. Here, the metal oxide layers 531 to 533 are collectively referred to as a metal oxide layer 530 in some cases.

The conductive layer 521 and the conductive layer 522 serve as a gate electrode (front gate electrode) and a back gate electrode, respectively, of the transistor 500. A region of the conductive layer 521 serving as a gate electrode is formed in a self-aligned manner so as to fill an opening formed in the insulating layer 516. The conductive layers 523 and 524 serve as a source electrode and a drain electrode. For example, in the case where the conductive layer 523 has a layered structure, it is preferable that a layer in contact with the metal oxide layer 532 be less likely to transmit oxygen than the other layers in the conductive layer 523. This can prevent a decrease in the conductivity of the conductive layer 523 due to oxidation. The above description also applies to the conductive layer 524.

The metal oxide layer 532 is formed using a semiconductor and includes a channel formation region. The metal oxide layer 531 and the metal oxide layer 532 form a metal oxide stack. In the stack, a region 535 in contact with the conductive layer 523 and a region 536 in contact with the conductive layer 524 have a lower resistivity than other regions. The region 535 contributes to a reduction in the contact resistance between the stack and the conductive layer 523. Similarly, the region 536 contributes to a reduction in the contact resistance between the stack and the conductive layer 524.

The insulating layers 511 to 517 each serve as a passivation layer or an interlayer insulating layer. Specifically, the insulating layer 511 serves as a base insulating layer of the transistor 500, and the insulating layer 515 serves as a gate insulating layer. The insulating layer 513 may include a charge accumulation layer.

As shown in FIG. 13C, a side surface of the metal oxide layer 532 is surrounded by the conductive layer 521. In such a device structure, the metal oxide layer 532 can be electrically surrounded by an electric field of the conductive layer 521 (gate electrode). A structure in which a semiconductor (particularly, a channel formation region) is electrically surrounded by an electric field of a gate electrode is referred to as a surrounded channel (s-channel) structure. A channel of the s-channel transistor is formed in the whole (bulk) of the metal oxide layer 532. Therefore, a high current can flow between a source and a drain of the s-channel transistor, which leads to favorable on-current characteristics. Moreover, the s-channel structure is suitable for a miniaturized transistor. Thus, the s-channel transistor can have a high on-state current and is suitable for a semiconductor device that requires a miniaturized transistor, such as a processor or a memory device.

Figure 14A:
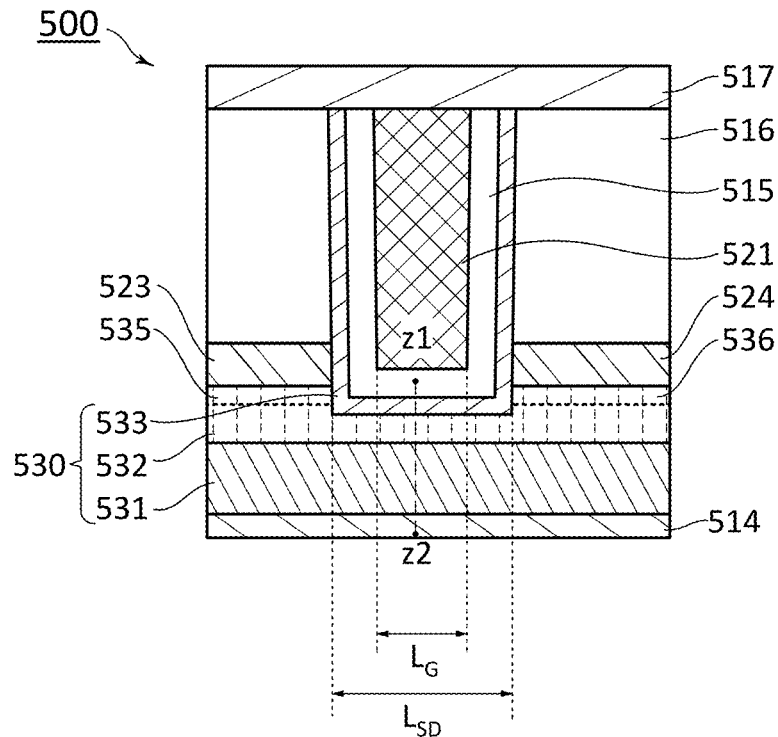
FIG. 14A is an enlarged view of part of FIG. 13B.

FIG. 14A is an enlarged view of the channel formation region of the transistor 500. In FIG. 14A, a width $L_G$ represents the length in the channel length direction of a region in which the bottom surface of the conductive layer 521 overlaps with the top surface of the metal oxide layer 532 with the insulating layer 515 and the metal oxide layer 533 positioned therebetween. The width $L_G$ corresponds to the line width of the gate electrode of the transistor 500. In FIG. 14A, a width $L_{SD}$ represents the length between the conductive layer 523 and the conductive layer 524. The width $L_{SD}$ corresponds to the length between the source electrode and the drain electrode of the transistor 500.

In general, the width $L_{SD}$ is determined by the minimum feature size. As illustrated in FIG. 14A, the width $L_G$ is smaller than the width $L_{SD}$. This means that the line width of the gate electrode of the transistor 500 can be made smaller than the minimum feature size. For example, the width $L_G$ can be greater than or equal to 5 nm and less than or equal to 60 nm, preferably greater than or equal to 5 nm and less than or equal to 30 nm.

<Metal Oxide>

The metal oxide layer 532 is an oxide semiconductor containing indium (In), for example. The metal oxide layer 532 containing indium has a high carrier mobility (electron mobility), for example. The metal oxide layer 532 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having a high bonding energy with oxygen, for example, an element whose bonding energy with oxygen is higher than that of indium. Alternatively, the element M is an element having a function of increasing the energy gap of the metal oxide, for example. Furthermore, the metal oxide layer 532 preferably contains zinc (Zn), because a metal oxide containing zinc is easily crystallized in some cases.

The metal oxide layer 532 is not limited to the oxide semiconductor containing indium. For example, the metal oxide layer 532 may be formed using an oxide semiconductor that does not contain indium and contains at least one of zinc, gallium, and tin. Specifically, the metal oxide layer 532 can be formed using zinc tin oxide, gallium tin oxide, or the like.

For the metal oxide layer 532, for example, an oxide semiconductor with a large energy gap is used. For example, the energy gap of the metal oxide layer 532 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. A CAAC-OS described later is preferably used for the metal oxide layer 532.

For example, the metal oxide layers 531 and 533 preferably contain at least one of the metal elements contained in the metal oxide layer 532, in which case an interface state is less likely to be generated at the interface between the metal oxide layer 531 and the metal oxide layer 532 and the interface between the metal oxide layer 532 and the metal oxide layer 533.

In the case where an In-M-Zn oxide is used for the metal oxide layer 531, the proportions of In and M, the sum of which is assumed to be 100 atomic %, are preferably lower than 50 atomic % and higher than 50 atomic %, respectively, further preferably lower than 25 atomic % and higher than 75 atomic %, respectively. When the metal oxide layer 531 is deposited by a sputtering method, a sputtering target with an atomic ratio of In:M:Zn=1:3:2, 1:3:4, or the like can be used.

In the case where an In-M-Zn oxide is used for the metal oxide layer 532, the proportions of In and M, the sum of which is assumed to be 100 atomic %, are preferably higher than 25 atomic % and lower than 75 atomic %, respectively, further preferably higher than 34 atomic % and lower than 66 atomic %, respectively. When the metal oxide layer 532 is deposited by a sputtering method, a sputtering target with an atomic ratio of In:M:Zn=1:1:1, 1:1:1.2, 2:1:3, 3:1:2, 4:2:4.1, 5:1:7, or the like can be used. In particular, when a sputtering target with an atomic ratio of In to Ga and Zn of 4:2:4.1 is used, the atomic ratio of In to Ga and Zn in the deposited metal oxide layer 532 may be 4:2:3 or in the neighborhood of 4:2:3.

In the case where an In-M-Zn oxide is used for the metal oxide layer 533, the proportions of In and M, the sum of which is assumed to be 100 atomic %, are preferably lower than 50 atomic % and higher than 50 atomic %, respectively, further preferably lower than 25 atomic % and higher than 75 atomic %, respectively. When the metal oxide layer 533 is deposited by a sputtering method, a sputtering target with an atomic ratio of In:M:Zn=1:3:2, 1:3:4, or the like can be used. The metal oxide layer 533 may be formed using the same kind of metal oxide as the metal oxide layer 531.

The metal oxide layer 531 or the metal oxide layer 533 does not necessarily contain indium in some cases. For example, the metal oxide layer 531 or the metal oxide layer 533 may contain gallium oxide.

(Energy Band Structure)

Figure 14B:
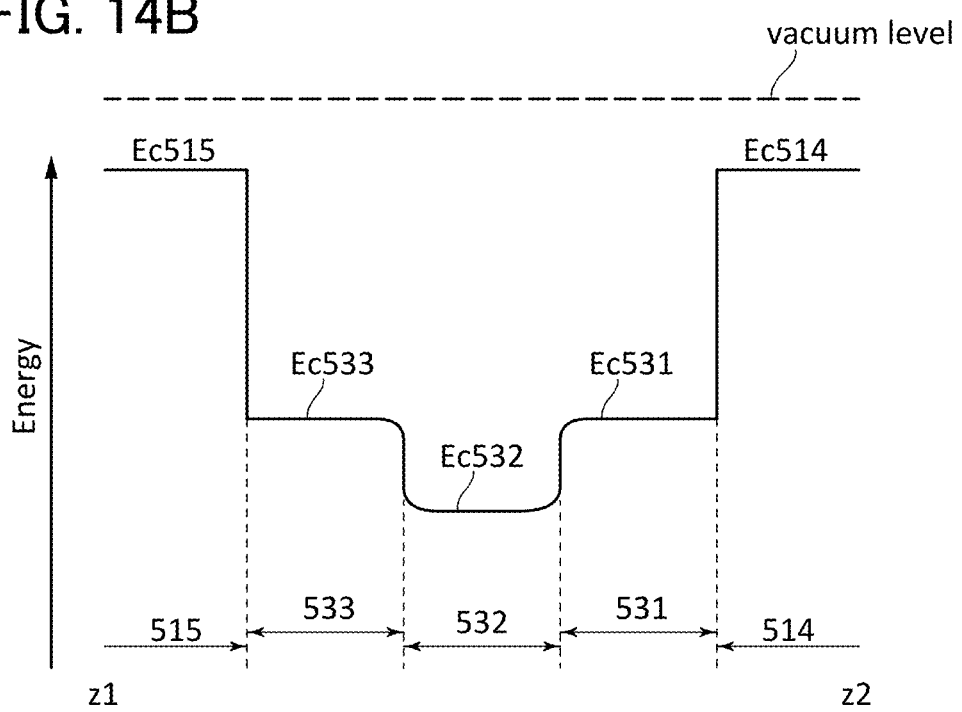
FIG. 14B is an energy band diagram of the transistor.

A function and an effect of the metal oxide layer 530 including the stacked metal oxide layers 531 to 533 will be described using the energy band diagram in FIG. 14B. FIG. 14B shows the energy band structure of a portion along line z1-z2 in FIG. 14A. Ec514, Ec531, Ec532, Ec533, and Ec515 represent the energy of the conduction band minimum of the insulating layer 514, that of the metal oxide layer 531, that of the metal oxide layer 532, that of the metal oxide layer 533, and that of the insulating layer 515, respectively.

Here, the energy difference between the vacuum level and the conduction band minimum (the energy difference is also referred to as an electron affinity) corresponds to a value obtained by subtracting an energy gap from the energy difference between the vacuum level and the valence band maximum (the energy difference is also referred to as an ionization potential). Note that the energy gap can be measured using a spectroscopic ellipsometer. The energy difference between the vacuum level and the valence band maximum can be measured using an ultraviolet photoelectron spectroscopy (UPS) device.

Since the insulating layers 514 and 515 are insulators, Ec514 and Ec515 are closer to the vacuum level than Ec531 to Ec533 (have a lower electron affinity).

The metal oxide layer 532 is preferably formed using a metal oxide having a higher electron affinity than that used for the metal oxide layer 531 and the metal oxide layer 533. For example, the electron affinity of the metal oxide layer 532 is preferably higher than that of the metal oxide layer 531 by 0.07 eV or more and 1.3 eV or less. The difference between the electron affinity of the metal oxide layer 532 and that of the metal oxide layer 531 is preferably 0.1 eV or more and 0.7 eV or less, further preferably 0.15 eV or more and 0.4 eV or less. The same applies to the difference between the electron affinity of the metal oxide layer 532 and that of the metal oxide layer 533.

Indium gallium oxide has a low electron affinity and a high oxygen-blocking property. Therefore, the metal oxide layer 533 preferably contains indium gallium oxide. The fraction of gallium atoms [Ga/(In+Ga)] is, for example, higher than or equal to 70%, preferably higher than or equal to 80%, further preferably higher than or equal to 90%.

When a gate voltage is applied to the transistor 500, a channel is formed in the metal oxide layer 532 having a higher electron affinity in the metal oxide layer 530. At this time, electrons move mainly in the metal oxide layer 532, not in the metal oxide layers 531 and 533. Hence, even the presence of a large number of interface states, which inhibit the electron movement, at the interface between the metal oxide layer 531 and the insulating layer 514 or the interface between the metal oxide layer 533 and the insulating layer 515 hardly influences the on-state current of the transistor 500. In the transistor 500, the metal oxide layers 531 and 533 function like insulators.

In some cases, a mixed region of the metal oxide layer 531 and the metal oxide layer 532 exists therebetween. In some cases, a mixed region of the metal oxide layer 532 and the metal oxide layer 533 exists therebetween. The mixed region has a low interface state density. For this reason, the stack including the metal oxide layers 531 to 533 has a band structure in which the energy at each interface and in the vicinity of the interface changes continuously (continuous junction).

As described above, the interface between the metal oxide layer 531 and the metal oxide layer 532 or the interface between the metal oxide layer 532 and the metal oxide layer 533 has a low interface state density. Hence, the electron movement in the metal oxide layer 532 is less likely to be inhibited, which leads to an increase in the on-state current of the transistor 500.

The electron movement in the transistor 500 is inhibited, for example, in the case where physical unevenness of the channel formation region is large. To increase the on-state current of the transistor 500, for example, root mean square (RMS) roughness of the top surface of the metal oxide layer 532 or the bottom surface thereof (a formation surface; here, the top surface of the metal oxide layer 531) in a measurement area of 1 μm×1 μm may be less than 1 nm, preferably less than 0.6 nm, further preferably less than 0.5 nm, and still further preferably less than 0.4 nm. The average surface roughness (also referred to as Ra) in a measurement area of 1 μm×1 μm may be less than 1 nm, preferably less than 0.6 nm, further preferably less than 0.5 nm, and still further preferably less than 0.4 nm. The maximum difference (also referred to as P–V) in a measurement area of 1 μm×1 μm may be less than 10 nm, preferably less than 9 nm, further preferably less than 8 nm, and still further preferably less than 7 nm.

The electron movement is also inhibited in the case where the density of defect states is high in a region in which a channel is formed. For example, in the case where the metal oxide layer 532 includes oxygen vacancies (also denoted by $V_O$), donor states are formed by entry of hydrogen into sites of oxygen vacancies in some cases. In the following description, the state in which hydrogen occupies the site of an oxygen vacancy may be denoted by $V_OH$. $V_OH$ is a factor of decreasing the on-state current of the transistor because $V_OH$ causes electron scattering. Note that the site of an oxygen vacancy occupied by oxygen is more stable than that occupied by hydrogen. Therefore, by reducing oxygen vacancies in the metal oxide layer 532, the on-state current of the transistor can be increased in some cases.

For example, at a certain depth in the metal oxide layer 532 or in a certain region of the metal oxide layer 532, the hydrogen concentration measured by secondary ion mass spectrometry (SIMS) is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$.

As a method for reducing oxygen vacancies in the metal oxide layer 532, for example, excess oxygen contained in the insulating layer 514 is moved to the metal oxide layer 532 through the metal oxide layer 531. In that case, the metal oxide layer 531 is preferably a layer having oxygen permeability (a layer through which oxygen can pass or permeate).

The metal oxide layer 532 can have a thickness greater than or equal to 1 nm and less than or equal to 20 nm. The thickness of the metal oxide layer 532 depends on the channel length and can be reduced together with the channel length, for example, to 1 nm or more and 15 nm or less, or 1 nm or more and 10 nm or less.

The metal oxide layer 531 can have a thickness greater than or equal to 5 nm and less than or equal to 200 nm, greater than or equal to 10 nm and less than or equal to 120 nm, greater than or equal to 20 nm and less than or equal to 120 nm, or greater than or equal to 40 nm and less than or equal to 80 nm. The metal oxide layer 531 is preferably thicker than the metal oxide layer 532. An increase in the thickness of the metal oxide layer 531 can increase the distance from the interface between the adjacent insulator and the metal oxide layer 531 to the channel formation region.

The metal oxide layer 533 can have a thickness greater than or equal to 1 nm and less than or equal to 100 nm, greater than or equal to 1 nm and less than or equal to 50 nm, or greater than or equal to 1 nm and less than or equal to 10 nm. The metal oxide layer 533 is preferably thinner than the metal oxide layer 531 so that the on-state current of the transistor 500 can be increased.

For example, a region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 531. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. A region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 533. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$.

It is preferable to reduce the hydrogen concentration in the metal oxide layer 531 and the metal oxide layer 533 in order to reduce the hydrogen concentration in the metal oxide layer 532. The metal oxide layer 531 and the metal oxide layer 533 each include a region in which the hydrogen concentration measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is also preferable to reduce the nitrogen concentration in the metal oxide layer 531 and the metal oxide layer 533 in order to reduce the nitrogen concentration in the metal oxide layer 532. The metal oxide layer 531 and the metal oxide layer 533 each include a region in which the nitrogen concentration is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$. Note that the nitrogen concentration is measured by SIMS.

The metal oxide layers 531 to 533 may be deposited by a sputtering method, a CVD method, a molecular beam epitaxy (MBE) method, a pulsed laser deposition (PLD) method, an ALD method, or the like.

After the metal oxide layers 531 and 532 are formed, first heat treatment is preferably performed. The first heat treatment may be performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in the following manner: heat treatment is performed in an inert gas atmosphere, and then, another heat treatment is performed in an atmosphere containing an oxidizing gas at 10 ppm or more, 1% or more, or 10% or more in order to compensate desorbed oxygen. The first heat treatment can increase the crystallinity of the metal oxide layers 531 and 532 and remove impurities such as hydrogen and water.

One embodiment of the present invention is not limited to the example in FIGS. 13A to 13C, in which the metal oxide layer 530 has a three-layer structure. For example, the metal oxide layer 530 can have a two-layer structure without the metal oxide layer 531 or the metal oxide layer 533. Alternatively, it is also possible to employ an m-layer structure (m is an integer greater than 3) in which a single layer or a stack including any of the metal oxides shown as examples of the materials of the metal oxide layers 531 to 533 is provided in at least one of the positions over, under, and in the metal oxide layer 530.

<Substrate>

As the substrate 510, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. The semiconductor substrate may have a bulk structure or a silicon on insulator (SOI) structure. Examples of the conductor substrate include a graphite substrate, a metal substrate, an alloy substrate (e.g., a stainless steel substrate), a conductive resin substrate, a substrate including a metal nitride, and a substrate including a metal oxide.

A flexible substrate may be used as the substrate 510. An example of the flexible substrate is a substrate made of a metal, an alloy, a resin, glass, or a fiber thereof. The flexible substrate preferably has a lower coefficient of linear expansion because deformation due to an environment is suppressed. The flexible substrate may be formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 510 because its coefficient of linear expansion is low. Alternatively, a sheet, a film, or foil containing a fiber may be used as the substrate 510. The substrate 510 may have elasticity.

The following methods can be given as examples of a method for providing a transistor over a flexible substrate: (1) a transistor is formed over a flexible substrate; and (2) a transistor is formed over a non-flexible substrate, and then, an element layer in which the transistor is formed is separated from the non-flexible substrate and transferred to a flexible substrate. In the latter method, the element layer is preferably formed over a separation layer provided over the non-flexible substrate.

The element layer in which the transistor is formed may be provided between the substrate 510 and the insulating layer 511.

<Back Gate Electrode, Gate Electrode, Source Electrode, and Drain Electrode>

Each of the conductive layers 522 to 524 preferably has a single-layer structure or a stacked-layer structure including a conductive film containing a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of the low-resistance material, or a compound containing such a material as its main component.

It is particularly preferable to use a high-melting-point material that has both heat resistance and conductivity, such as tungsten or molybdenum, or a low-resistance conductive material, such as aluminum or copper. Furthermore, a Cu—Mn alloy is preferably used, in which case manganese oxide formed at the interface with an insulator containing oxygen has a function of preventing Cu diffusion. A conductive oxide containing a noble metal, such as iridium oxide, ruthenium oxide, or strontium ruthenate, hardly extracts oxygen from an oxide semiconductor even when it is in contact with the oxide semiconductor. Therefore, the conductive oxide containing a noble metal is suitable as a material used for the conductive layers 523 and 524.

<Low-Resistance Region>

The regions 535 and 536 are formed in such a manner that the conductive layers 523 and 524 extract oxygen from the metal oxide layer 532, for example. Oxygen is more likely to be extracted at a higher temperature. Oxygen vacancies are formed in the regions 535 and 536 through several heating steps in the manufacturing process of the transistor 500. Furthermore, the heating makes hydrogen enter the sites of oxygen vacancies, increasing the carrier concentration in the regions 535 and 536. As a result, the resistance of the regions 535 and 536 is reduced.

<Insulating Layer>

The insulating layers 511 to 517 can each be formed using an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like, for example. The materials and layer structures of the insulating layers 511 to 517 may be determined in accordance with characteristics required for them.

Note that in this specification and the like, oxynitride refers to a compound that contains more oxygen than nitrogen, and nitride oxide refers to a compound that contains more nitrogen than oxygen.

The insulating layer 514 preferably includes an insulator capable of supplying oxygen to the metal oxide layer 530. In particular, the insulating layer 514 preferably includes an insulator from which part of oxygen is released by heating. Oxygen released from the insulating layer 514 is supplied to the metal oxide layer 530, so that oxygen vacancies in the metal oxide layer 530 can be reduced. Consequently, a change in the electrical characteristics of the transistor 500 can be suppressed and the reliability can be improved.

For example, the insulating layer 514 may be formed using a metal oxide such as silicon oxide, silicon oxynitride, aluminum oxide, aluminum oxynitride, gallium oxide, gallium oxynitride, yttrium oxide, yttrium oxynitride, hafnium oxide, or hafnium oxynitride.

The insulating layer 514 may contain excess oxygen to be supplied to the metal oxide layer 530. For this purpose, the insulating layer 514 may be deposited in an oxygen atmosphere, for example. Alternatively, a region containing excess oxygen may be formed by introducing oxygen into the deposited insulating layer 514. These two methods may be combined.

For example, oxygen (including at least oxygen radicals, oxygen atoms, or oxygen ions) is introduced into the deposited insulating layer 514, so that a region containing excess oxygen is formed. Oxygen can be introduced by an ion implantation method, an ion doping method, a plasma immersion ion implantation method, plasma treatment, or the like. An oxygen-containing gas can be used for the oxygen introduction treatment. As the oxygen-containing gas, oxygen, nitrous oxide, nitrogen dioxide, carbon dioxide, or carbon monoxide can be used, for example. The oxygen-containing gas used for the oxygen introduction treatment may further contain a rare gas, hydrogen, or the like. For example, a mixed gas of carbon dioxide, hydrogen, and argon may be used.

The insulating layer 514 preferably has a passivation function of preventing a decrease in the amount of oxygen contained in the metal oxide layer 530 after the fabrication of the transistor 500. The insulating layer 514 can prevent outward diffusion of oxygen from the metal oxide layer 530 and entry of hydrogen, water, or the like into the metal oxide layer 530 from the outside. The insulating layer 514 having such a function can be formed using an insulator containing a nitride, a nitride oxide, an oxide, or an oxynitride, for example. Examples of the insulator include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride.

The insulating layer 513 may include a charge accumulation layer. In that case, the threshold voltage of the transistor 500 can be adjusted by injecting electrons into the insulating layer 513. Electrons can be injected into the charge accumulation layer by, for example, inputting a positive high voltage to a back gate electrode (the conductive layer 522) after the transistor 500 is completed.

An insulator that can be used for the charge accumulation layer contains, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, an insulating layer or a stack of insulating layers including one or more materials selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide may be used.

The insulating layer 515, which serves as a gate insulating film, preferably includes an insulator with a high relative permittivity. For example, the insulating layer 515 is preferably formed using gallium oxide, hafnium oxide, an oxide containing aluminum and hafnium, an oxynitride containing aluminum and hafnium, an oxide containing silicon and hafnium, or an oxynitride containing silicon and hafnium.

If the insulating layer 515 contains silicon oxide or silicon oxynitride on the metal oxide layer 533 side, for example, trap centers might be formed at the interface between aluminum oxide, gallium oxide, or hafnium oxide and silicon oxide or silicon oxynitride. The trap centers can shift the threshold voltage of the transistor in the positive direction by capturing electrons in some cases.

The insulating layer 516 preferably includes an insulator with a low relative permittivity. For example, the insulating layer 516 preferably includes silicon oxide, silicon oxynitride, silicon nitride oxide, silicon nitride, or a resin. Alternatively, the insulating layer preferably has a stacked-layer structure including silicon oxide or silicon oxynitride and a resin. When silicon oxide or silicon oxynitride, which are thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic. Like the insulating layer 514, the insulating layer 516 preferably has a function of supplying oxygen to the metal oxide layer 530.

The insulating layer 517 is a passivation layer having a function of blocking oxygen, hydrogen, water, an alkali metal, an alkaline earth metal, or the like. The insulating layer 517 can prevent outward diffusion of oxygen from the metal oxide layer 530 and entry of hydrogen, water, or the like into the metal oxide layer 530 from the outside. An example of such an insulating layer having a passivation function is a layer including silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like. An aluminum oxide layer is favorably used as the insulating layer 517 because it is highly effective in preventing both oxygen and impurities such as hydrogen and moisture from permeating the film.

It is preferable to perform second heat treatment at any time after the deposition of the insulating layer 517. Through the second heat treatment, oxygen contained in the insulating layers 514 and 516 is diffused and reaches the metal oxide layer 530, whereby oxygen vacancies in the metal oxide layer 530 can be reduced. In the second heat treatment, the insulating layer 517 prevents upward diffusion of oxygen through the insulating layer 517, and the insulating layer 513 prevents downward diffusion of oxygen through the insulating layer 513; accordingly, oxygen can be efficiently supplied to the metal oxide layer 530.

Note that the second heat treatment may be performed at a temperature that allows oxygen contained in the insulating layers 514 and 516 to be diffused into the metal oxide layer 530. For example, the description of the first heat treatment can be referred to. The second heat treatment is preferably performed at a lower temperature than the first heat treatment. The temperature of the second heat treatment may be lower than that of the first heat treatment by 20° C. or more and 150° C. or less, preferably 40° C. or more and 100° C. or less. Accordingly, superfluous release of oxygen from the insulating layer 514 can be inhibited. In the case where heating at the time of deposition of a layer can double as the second heat treatment, the second heat treatment is not necessarily performed. As described above, oxygen can be supplied to the metal oxide layer 530 from above and below through the deposition of the insulating layer 517 and the second heat treatment. Alternatively, oxygen may be added to the insulating layers 514 and 516 by depositing a film containing indium oxide such as an In-M-Zn oxide as the insulating layer 517.

Transistor Structure Example 2

Figure 15A:
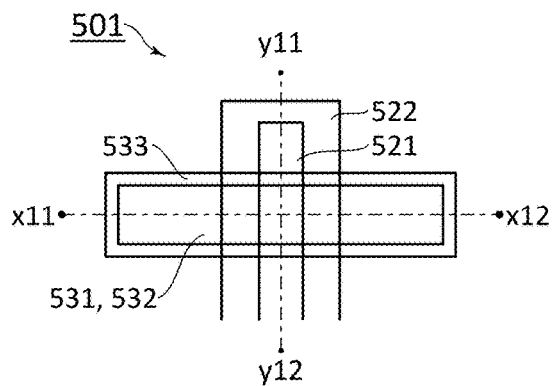
FIG. 15A is a top view showing a structure example of a transistor.
Figure 15B:
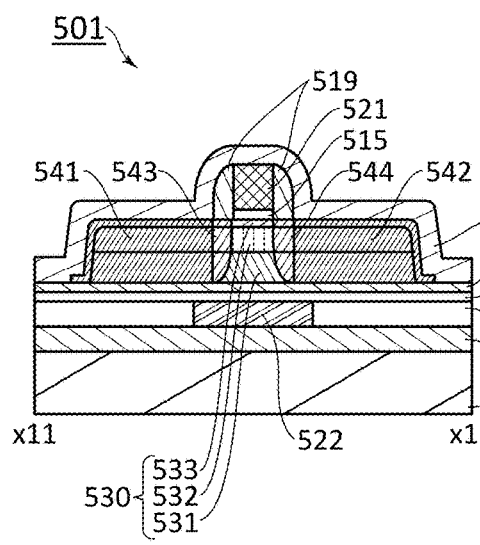
FIG. 15B is a cross-sectional view along line x11-x12 of FIG. 15A.
Figure 15C:
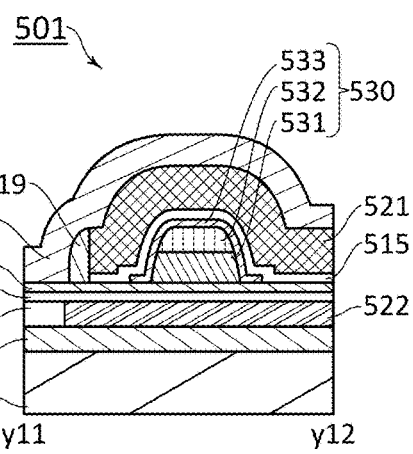
FIG. 15C is a cross-sectional view along line y11-y12 of FIG. 15A.

FIG. 15A is a top view of a transistor 501. FIG. 15B is a cross-sectional view along line x11-x12 in FIG. 15A, and FIG. 15C is a cross-sectional view along line y11-y12 in FIG. 15A. The transistor 501 has an s-channel structure like the transistor 500 and the like. In the transistor 501, an insulating layer 519 is provided in contact with a side surface of the conductive layer 521 that serves as a gate electrode. The insulating layer 519 serves as a sidewall insulating layer of the transistor 501.

Regions 541 to 544 are formed in the metal oxide layer 530. These regions are low-resistance regions with lower resistivity than another region (typically a region overlapping with the conductive layer 521). The regions 541 to 544 are formed in a self-aligned manner in an impurity addition step in which the conductive layer 521 and the insulating layer 519 are used as masks. The regions 541 to 544 are formed by adding a rare gas element (Ar, Xe, Kr, Ne, or He) to the metal oxide layer 530 with an ion implantation apparatus, an ion doping apparatus, a plasma doping apparatus, a plasma treatment apparatus, or the like. Hydrogen, nitrogen, boron, phosphorus, arsenic, tungsten, aluminum, or the like may be added as an impurity. The regions 541 and 542 have a lower resistivity than the regions 543 and 544.

Transistor Structure Example 3

FIGS. 16A to 16D show a structure example of a transistor. FIG. 16A is a top view showing a structure example of a transistor 502. FIGS. 16B, 16C, and 16D are cross-sectional views along lines x11-x12, y11-y12, and y13-y14, respectively, in FIG. 16A.

The metal oxide layer 533 is formed to cover the metal oxide layers 531 and 532 and the conductive layers 523 and 524. The insulating layer 515 covers the metal oxide layer 533. Here, the metal oxide layer 533 and the insulating layer 515 are etched using the same mask.

The transistor 502 has an s-channel structure like the transistor 500. In the transistor 500, the metal oxide layer 533, the insulating layer 515, and the conductive layer 521 are formed so as to fill the opening in the insulating layer 516; in contrast, the transistor 502 does not include the insulating layer 516. The opening in the insulating layer 516 enables the gate electrode of the transistor 500 to be formed in a self-aligned manner; therefore, the transistor 500 is suitable for miniaturization. The parasitic capacitance of the conductive layer 521 can be reduced in the transistor 500 as compared with that in the transistor 502.

The conductive layers 523 and 524 are formed using a hard mask used for forming the stack of the metal oxide layers 531 and 532. Therefore, the conductive layers 523 and 524 do not have regions in contact with the side surfaces of the metal oxide layers 531 and 532. For example, the metal oxide layers 531 and 532 and the conductive layers 523 and 524 can be formed through the following steps. A two-layer oxide semiconductor film to be the metal oxide layers 531 and 532 is formed. A single-layer or multilayer conductive film is formed over the oxide semiconductor film. This conductive film is etched to form a hard mask. With the use of this hard mask, the two-layer oxide semiconductor film is etched to form the stack of the metal oxide layers 531 and 532. Then, the hard mask is etched to form the conductive layers 523 and 524.

Transistor Structure Example 4

Figure 17A:
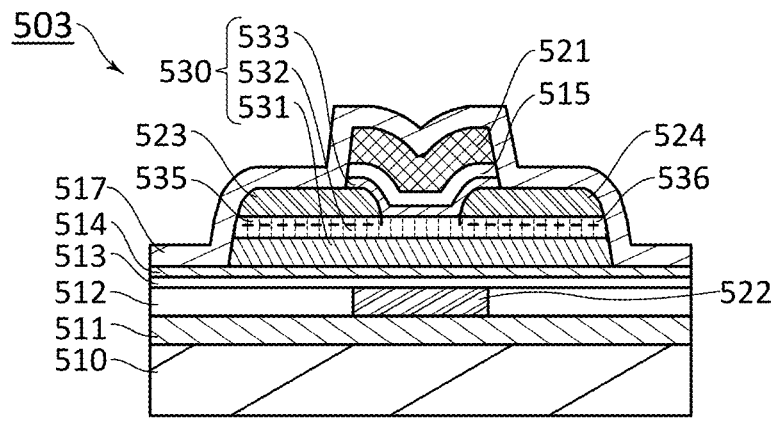
FIGS. 17A to 17C are cross-sectional views each showing a structure example of a transistor.

A transistor 503 shown in FIG. 17A is a modification example of the transistor 502. In the transistor 503, the metal oxide layer 533 and the insulating layer 515 are formed through an etching step with the conductive layer 521 used as a mask. The conductive layer 521 is thus present.

Transistor Structure Example 5

Figure 17B:
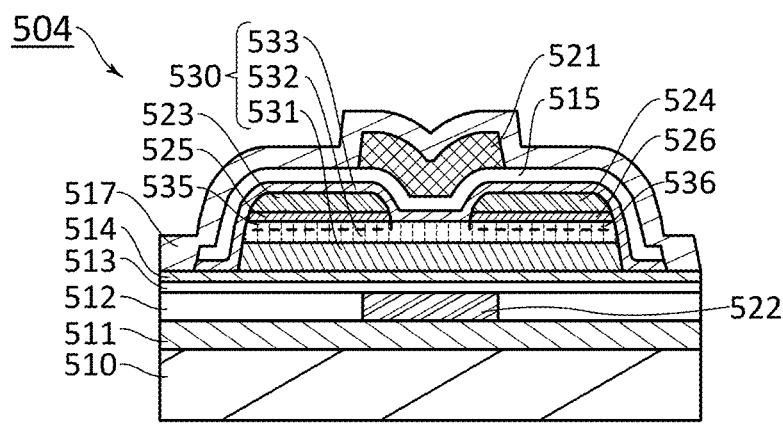

A transistor 504 shown in FIG. 17B is a modification example of the transistor 502. In the transistor 504, a conductive layer 525 is provided between the conductive layer 523 and the metal oxide layer 532, and a conductive layer 526 is provided between the conductive layer 524 and the metal oxide layer 532.

The conductive layers 525 and 526 are formed using a single-layer or multilayer conductor. The conductive layers 525 and 526 may include a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may also be used, and a conductor containing aluminum, a conductor containing copper and titanium, a conductor containing copper and manganese, a conductor containing indium, tin, and oxygen, a conductor containing titanium and nitrogen, or the like may be used.

The conductive layers 525 and 526 may have a property of transmitting visible light. Alternatively, the conductive layers 525 and 526 may have a property of not transmitting visible light, ultraviolet light, infrared light, or an X-ray by reflecting or absorbing it. In some cases, such a property can suppress a change in electrical characteristics of the transistor 504 due to stray light. The conductive layers 525 and 526 may preferably be formed using a layer that does not form a Schottky barrier with the metal oxide or the like. Accordingly, the on-state characteristics of the transistor 504 can be improved.

The conductive layers 525 and 526 are preferably formed using a conductive material with higher resistivity than that of the conductive layers 523 and 524 in some cases. The conductive layers 525 and 526 preferably have lower resistance than the channel (specifically, the metal oxide layer 532) of the transistor 504 in some cases. For example, the conductive layers 525 and 526 may have a resistivity of higher than or equal to 0.1 Ωcm and lower than or equal to 100 Ωkm, higher than or equal to 0.5 Ωcm and lower than or equal to 50 Ωkm, or higher than or equal to 1 Ωcm and lower than or equal to 10 Ωcm. The conductive layers 525 and 526 having resistivity within the above range can reduce electric field concentration in a boundary portion between the channel and the drain. Therefore, a change in electrical characteristics of the transistor 504 can be suppressed. In addition, punch-through current generated by an electric field from the drain can be reduced. Thus, a transistor with a small channel length can have favorable saturation characteristics. Note that in a circuit configuration where the source and the drain do not interchange, only one of the conductive layers 525 and 526 (e.g., the conductive layer on the drain side) is preferably provided in some cases.

Transistor Structure Example 6

Figure 17C:
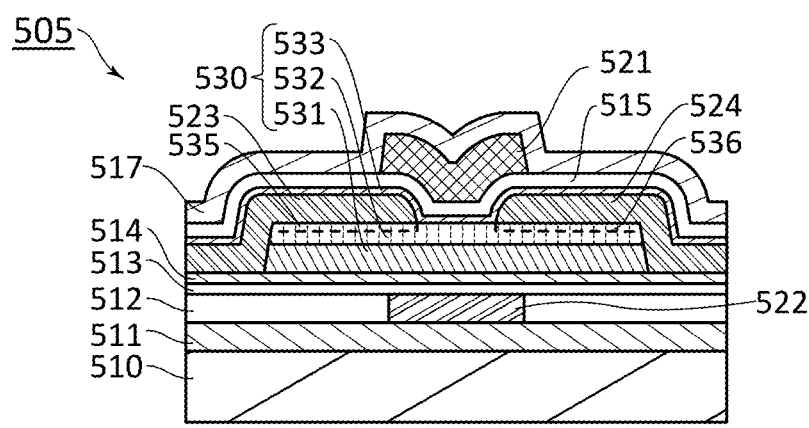

A transistor 505 shown in FIG. 17C is a modification example of the transistor 502. The transistor 505 is different from the transistor 502 in the shape of the conductive layers 523 and 524. In the transistor 505, the conductive layers 523 and 524 are in contact with side surfaces of the metal oxide layers 531 and 532.

Transistor Structure Example 7

In the transistor 502, the conductive layer 521 overlaps with the conductive layers 523 and 524. In other words, the gate electrode of the transistor 502 overlaps with the source and drain electrode thereof. The transistors 503 to 506 also have the same structure. This structure could cause a decrease in the upper voltage limit that can be applied to the transistor (a decrease in withstand voltage). FIG. 18 shows a structure example of a transistor with a high withstand voltage.

A transistor 505 shown in FIG. 18 can also be regarded as a modification example of the transistor 502. A conductor of the transistor 505 overlaps with neither the conductive layer 523 nor the conductive layer 524. In other words, in a cross-sectional view in the channel length direction, an edge of the conductive layer 521 is offset from an edge of the conductive layer 523, and an edge of the conductive layer 521 is offset from an edge of the conductive layer 524.

In addition, the metal oxide layer 533 is not provided in order to reduce a leakage current through the gate insulating layer. Here, the oxide semiconductor layer of the transistor 505 is a single layer with the metal oxide layer 531, though it may be a single layer with the metal oxide layer 532 or a stack of the metal oxide layers 531 and 532.

Modification Example

The transistors 500 to 506 may have a structure without the charge accumulation layer. Furthermore, the transistors 500 to 506 may have a structure without the back gate electrode (the conductive layer 522). In that case, either or both of the insulating layers 512 and 513 can be omitted.

Embodiment 4

In this embodiment, the structure of an oxide semiconductor will be described. An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

In general, an amorphous structure is thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. An a-like OS, which is not isotropic, has an unstable structure that includes a void. Because of its instability, an a-like OS has physical properties similar to those of an amorphous oxide semiconductor.

<CAAC-OS>

A CAAC-OS is one of oxide semiconductors and has a plurality of c-axis aligned crystal parts (also referred to as pellets).

Analysis of a CAAC-OS by X-ray diffraction (XRD) will be described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 19A. This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

In structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (φ scan) is performed with 2θ fixed at around 56° while the sample is rotated around a normal vector to the sample surface as an axis (φ axis), a peak is not clearly observed as shown in FIG. 19B. In the case where single-crystal $InGaZnO_4$ is subjected to φ scan with 2θ fixed at around 56°, six peaks which are derived from crystal planes equivalent to the (110) plane are observed as shown in FIG. 19C. Accordingly, the structural analysis using XRD confirms that the directions of the a-axes and b-axes are irregularly oriented in the CAAC-OS.

Figure 19D:
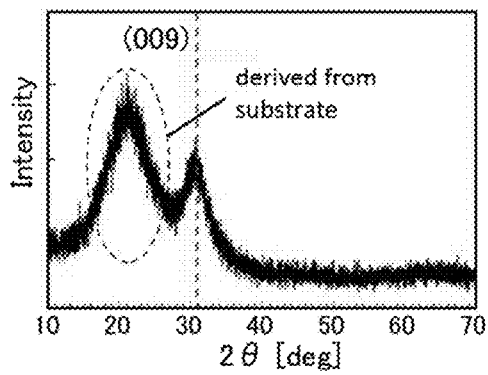
FIGS. 19D and 19E show selected-area electron diffraction patterns of a CAAC-OS.
Figure 19D:
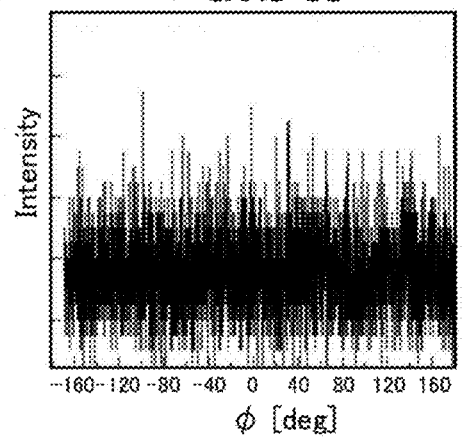
Figure 19D:
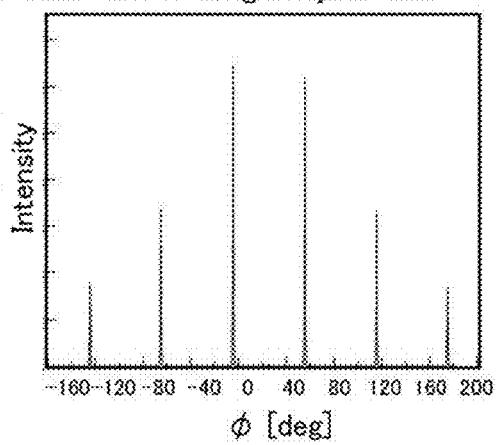
Figure 19D:
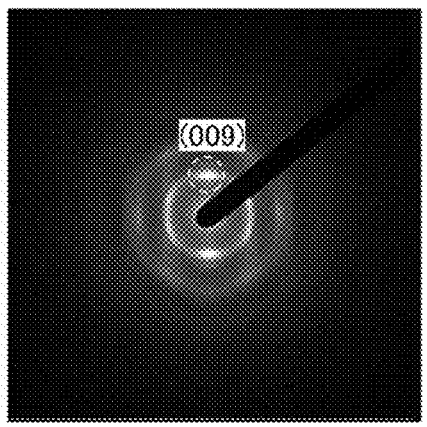
Figure 19E:
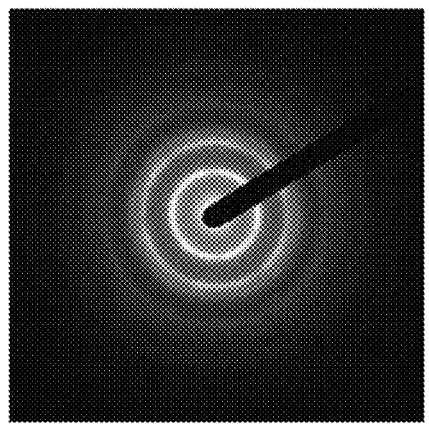

Next, a CAAC-OS analyzed by electron diffraction is described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) can be obtained as shown in FIG. 19D. This diffraction pattern includes spots derived from the (009) plane of the $InGaZnO_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. FIG. 19E shows a diffraction pattern that is observed when an electron beam with a probe diameter of 300 nm is perpendicularly incident on the sample surface. In FIG. 19E, a ring-like diffraction pattern is observed. Thus, the electron diffraction using an electron beam with a probe diameter of 300 nm can confirm that the a-axes and b-axes of the pellets included in the CAAC-OS do not have regular alignment. Note that the first ring in FIG. 19E is probably derived from the (010) plane, (100) plane, and the like of the $InGaZnO_4$ crystal. The second ring in FIG. 19E is probably derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 20A:
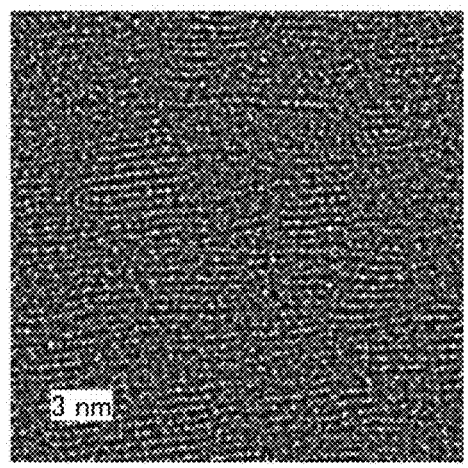
FIG. 20A is a high-resolution cross-sectional TEM image of a CAAC-OS.

FIG. 20A shows a high-resolution TEM image of a cross section of the CAAC-OS film which is observed from a direction substantially parallel to the sample surface. To observe a high-resolution TEM image, a spherical aberration corrector function is used. A high-resolution TEM image obtained with a spherical aberration corrector function is specifically referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 20A shows pellets in which metal atoms are arranged in a layered manner. Each pellet has a size of 1 nm or more, or 3 nm or more; hence, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 20B:
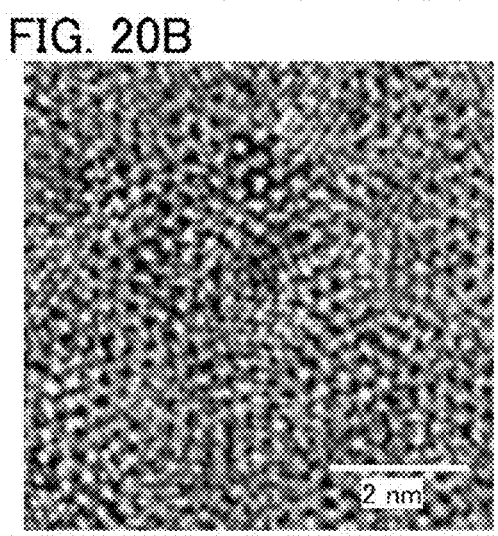
FIGS. 20B and 20C are high-resolution plan-view TEM images of the CAAC-OS.
Figure 20C:
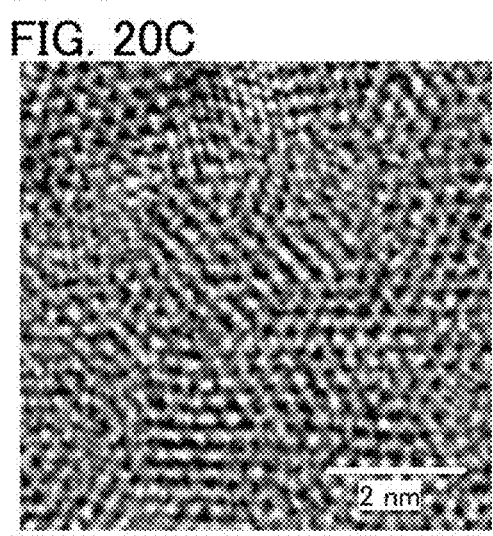
Figure 20D:
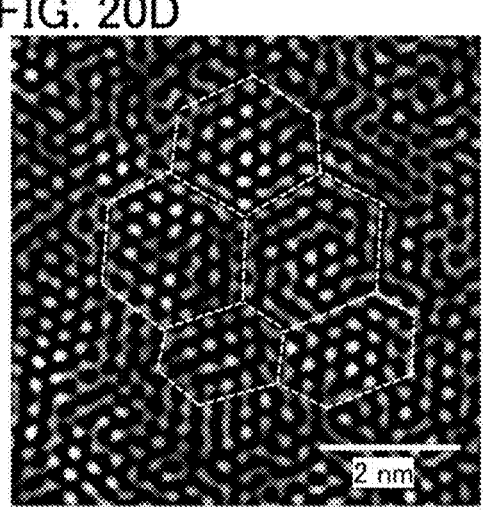
FIG. 20D is an image obtained through analysis of the image of FIG. 20B.
Figure 20E:
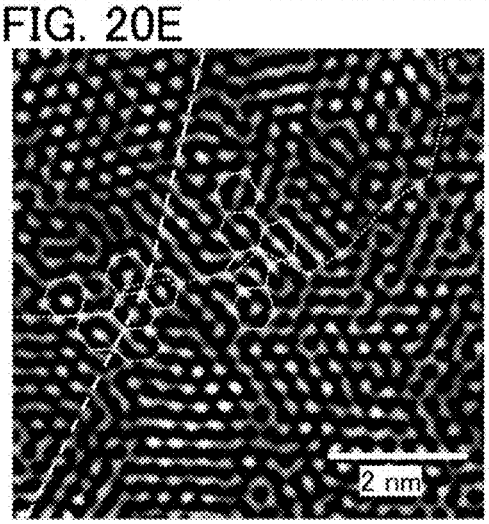
FIG. 20E is an image obtained through analysis of the image of FIG. 20C.

FIGS. 20B and 20C show Cs-corrected high-resolution TEM images of a plane of the CAAC-OS observed from a direction substantially perpendicular to the sample surface. FIGS. 20D and 20E are images obtained through image processing of FIGS. 20B and 20C. The method of image processing is as follows. The image in FIG. 20B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 20D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape.

Note that the shape of the pellet is not always a regular hexagon but is a non-regular hexagon in many cases.

In FIG. 20E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, includes pellets (nanocrystals) connected in the a-b plane direction, and has a crystal structure with distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element contained in an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius) and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<nc-OS>

Analysis of an nc-OS by XRD is described. For example, when the structure of an nc-OS is analyzed by an out-of-plane method, no peak indicating orientation appears. That is, a crystal of an nc-OS does not have orientation.

Figure 21A:
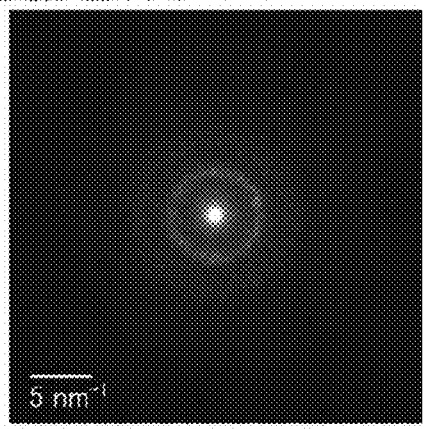
FIGS. 21A to 21C show electron diffraction patterns of an nc-OS.
Figure 21B:
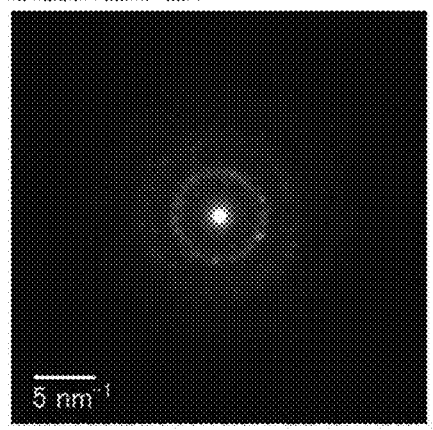

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (a nanobeam electron diffraction pattern) is observed as shown in FIG. 21A. FIG. 21B shows a diffraction pattern (a nanobeam electron diffraction pattern) obtained when an electron beam with a probe diameter of 1 nm is incident on the same sample. A plurality of spots are observed in the ring-like region as shown in FIG. 21B. Thus, ordering in an nc-OS is not observed with an electron beam with a probe diameter of 50 nm but is observed with an electron beam with a probe diameter of 1 nm.

Figure 21C:
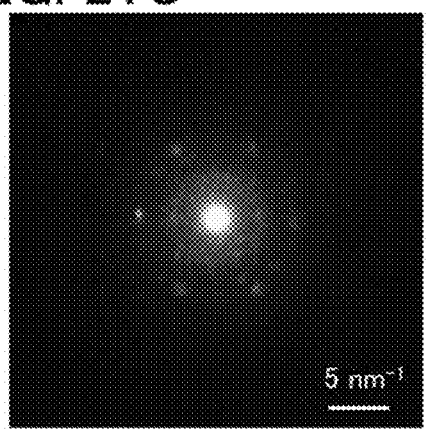

When an electron beam with a probe diameter of 1 nm is incident on a region with a thickness less than 10 nm, an electron diffraction pattern in which spots are arranged in an approximately regular hexagonal shape is observed in some cases as shown in FIG. 21C. This means that an nc-OS has a well-ordered region, that is, a crystal, in the thickness range of less than 10 nm. Note that no electron diffraction pattern having regularity is observed in some regions because crystals are oriented in various directions.

Figure 21D:
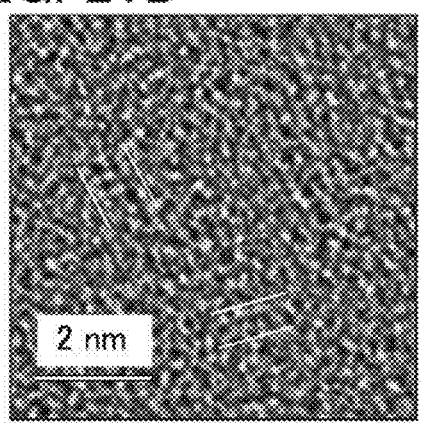
FIG. 21D is a Cs-corrected high-resolution TEM image of a cross-section of the nc-OS.

FIG. 21D shows a Cs-corrected high-resolution TEM image of a cross section of an nc-OS observed from a direction substantially parallel to the formation surface. In a high-resolution TEM image, an nc-OS has a region in which a crystal part is observed, such as the part indicated by additional lines in FIG. 21D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size of greater than or equal to 1 nm and less than or equal to 10 nm, in particular, a region with a size of greater than or equal to 1 nm and less than or equal to 3 nm) has a periodic atomic arrangement as described above. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 22A:
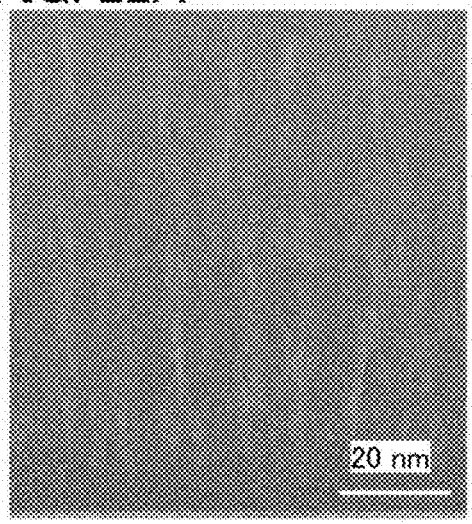
FIGS. 22A and 22B are high-resolution cross-sectional TEM images of an a-like OS.
Figure 22B:
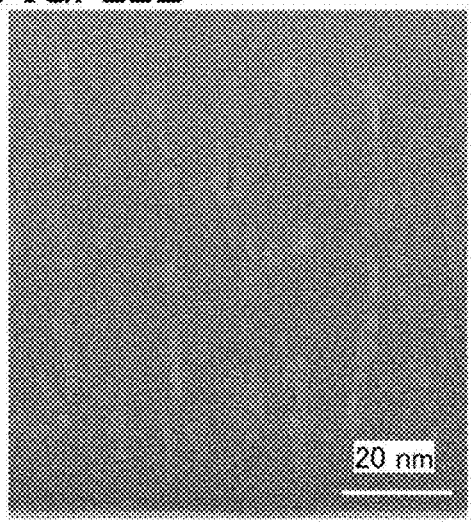

FIGS. 22A and 22B are high-resolution cross-sectional TEM images of an a-like OS. FIG. 22A is the high-resolution cross-sectional TEM image of the a-like OS at the start of the electron irradiation. FIG. 22B is the high-resolution cross-sectional TEM image of a-like OS after the electron (e) irradiation at $4.3\times10^8$ $e^-/nm^2$. FIGS. 22A and 22B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 23:
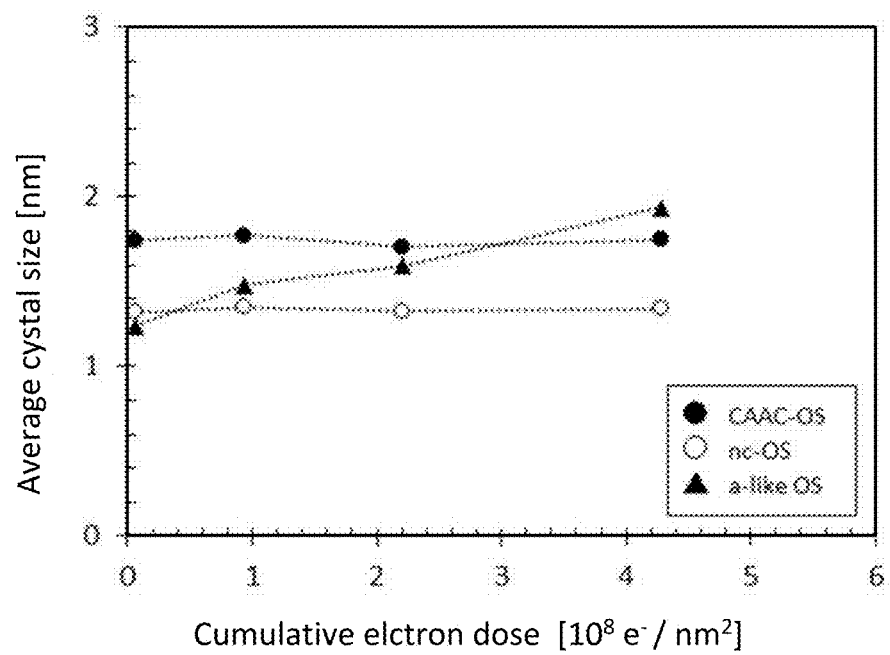
FIG. 23 shows a change of crystal parts of an In—Ga—Zn oxide owing to electron irradiation.

FIG. 23 shows the average size of crystal parts (at 22 points to 30 points) in each sample. Note that the crystal part size corresponds to the length of a lattice fringe. FIG. 23 indicates that the crystal part size in the a-like OS increases with an increase in the cumulative electron dose in obtaining TEM images, for example. As shown in FIG. 23, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 23, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ $e^-/(nm^2\cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

Information about this specification and the like will be described below. In this specification and the like, an explicit description "X and Y are connected" means that X and Y are electrically connected, X and Y are functionally connected, and X and Y are directly connected. Accordingly, without being limited to a predetermined connection relation, for example, a connection relation other than that shown in a drawing or text is also possible. X and Y each denote an object (e.g., a device, an element, a circuit, a wiring, an electrode, a terminal, a conductive film, or a layer).

A voltage usually refers to a potential difference between a given potential and a reference potential (e.g., a ground potential (GND) or a source potential). Thus, a voltage can be referred to as a potential. Note that a potential has a relative value. Accordingly, "ground potential" does not necessarily mean 0 V.

A transistor has three terminals: a gate, a source, and a drain. The gate serves as a control terminal for controlling the on/off state of the transistor. Functions of input/output terminals of the transistor depend on the type and the levels of potentials applied to the terminals, and one of the two terminals serves as a source and the other serves as a drain. Therefore, in this specification and the like, the terms "source" and "drain" can be used to denote the drain and the source, respectively. In this specification and the like, the two terminals other than the gate may also be referred to as a first terminal and a second terminal, a third terminal and a fourth terminal, or the like.

A node can be referred to as a terminal, a wiring, an electrode, a conductor, an impurity region, or the like depending on the circuit configuration, the device structure, or the like. Furthermore, a terminal and the like can be referred to as a node.

In this specification and the like, the terms "film" and "layer" can be interchanged with each other depending on the case or circumstances. For example, in some cases, the term "conductive film" can be used instead of the term "conductive layer", and the term "insulating layer" can be used instead of the term "insulating film".

In the drawings, the size, the layer thickness, or the region is exaggerated for clarity in some cases. Therefore, one embodiment of the present invention is not limited to such a scale. Note that the drawings schematically show ideal examples, and one embodiment of the present invention is not limited to a shape or a value shown in the drawings. For example, variation in signal, voltage, or current due to noise or difference in timing can be included.

In this specification, terms for explaining arrangement, such as "over" and "under", are sometimes used for convenience to describe the positional relation between components with reference to drawings. The positional relation between components is changed as appropriate in accordance with the direction in which the components are described. Thus, the positional relation is not limited by a term used in the specification and can be described with another term as appropriate depending on the circumstances.

The positional relation of circuit blocks in block diagrams are specified for description, and even in the case where different circuit blocks have different functions in the diagrams, the different circuit blocks may be provided in an actual circuit block so that different functions are achieved in the same circuit block. In addition, the functions of circuit blocks are specified for description, and even in the case where one circuit block is illustrated, blocks may be provided in an actual circuit block so that processing performed by one circuit block is performed by a plurality of circuit blocks.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification and the like, the trigonal and rhombohedral crystal systems are included in the hexagonal crystal system.

This application is based on Japanese Patent Application serial No. 2015-142985 filed with Japan Patent Office on Jul. 17, 2015, the entire contents of which are hereby incorporated by reference.

What is claimed is:

1. A semiconductor device comprising:
an insulating layer;
a first resistor over the insulating layer; and
a second resistor covered with the insulating layer,
wherein the insulating layer is between the first resistor and the second resistor,
wherein the first resistor and the second resistor are electrically connected in series,
wherein a resistance material of the first resistor includes a metal oxide,
wherein the metal oxide includes indium,
wherein a resistance material of the second resistor is different from the resistance material of the first resistor,
wherein a resistance value of the second resistor has high temperature dependence, and
wherein a resistance value of the first resistor has low temperature dependence.

2. The semiconductor device according to claim 1,
wherein the second resistor is a thermistor, a resistance thermometer, or a thermocouple.

3. The semiconductor device according to claim 1,
wherein the resistance material of the second resistor includes silicon.

4. The semiconductor device according to claim 1,
wherein the metal oxide includes zinc.

5. A vehicle comprising:
the semiconductor device according to claim 1; and
a car body.

6. The semiconductor device according to claim 1,
wherein the first resistor is a transistor.

7. The semiconductor device according to claim 1,
wherein the second resistor is a transistor.

8. The semiconductor device according to claim 1,
wherein the first resistor and the second resistor overlap each other.

9. A semiconductor device comprising:
an insulating layer;
a first circuit comprising:
a first resistor over the insulating layer; and
a second resistor covered with the insulating layer; and
a second circuit,
wherein the insulating layer is between the first resistor and the second resistor,
wherein a first terminal of the first resistor is electrically connected to a first terminal of the second resistor,
wherein a resistance material of the first resistor includes a metal oxide,
wherein the metal oxide includes indium, and
wherein a resistance material of the second resistor is different from the resistance material of the first resistor,
wherein a resistance value of the second resistor has high temperature dependence,
wherein a resistance value of the first resistor has low temperature dependence, and
wherein the second circuit is configured to process a voltage output from the first terminal of the first resistor and generate a signal.

10. The semiconductor device according to claim 9, further comprising an electronic component,
wherein the electronic component includes a package and a die placed in the package, and
wherein the first resistor and the second circuit are provided in the die.

11. The semiconductor device according to claim 9, further comprising an electronic component,
wherein the electronic component includes a package and a die placed in the package, and
wherein the first resistor, the second resistor, and the second circuit are provided in the die.

12. The semiconductor device according to claim 9,
wherein the second resistor is a thermistor, a resistance thermometer, or a thermocouple.

13. The semiconductor device according to claim 9,
wherein the resistance material of the second resistor includes silicon.

14. The semiconductor device according to claim 9,
wherein the first resistor is stacked over the second circuit.

15. The semiconductor device according to claim 9,
wherein the metal oxide includes zinc.

16. The semiconductor device according to claim 9,
wherein a first voltage is configured to be input to a second terminal of the first resistor, and
wherein a second voltage which is lower than the first voltage is configured to be input to a second terminal of the second resistor.

17. A vehicle comprising:
the semiconductor device according to claim 9; and
a car body.

18. A semiconductor device comprising:
an insulating layer;
a first circuit comprising:
 a first resistor over the insulating layer; and
 a second resistor covered with the insulating layer;
a second circuit electrically connected to the first circuit;
a voltage generation circuit electrically connected to the second circuit; and
an LED electrically connected to the voltage generation circuit,
wherein the insulating layer is between the first resistor and the second resistor,
wherein a first terminal of the first resistor is electrically connected to a first terminal of the second resistor,
wherein a resistance material of the first resistor includes a metal oxide,
wherein the metal oxide includes indium, and
 wherein a resistance material of the second resistor is different from the resistance material of the first resistor,
wherein a resistance value of the second resistor has high temperature dependence, wherein a resistance value of the first resistor has low temperature dependence,
wherein the first circuit is configured to output a voltage corresponding to the resistance values of the first resistor and the second resistor,
wherein the second circuit is configured to generate a signal in accordance with the voltage output from the first circuit, and
wherein the voltage generation circuit is configured to output a voltage for driving the LED in accordance with the signal.

19. The semiconductor device according to claim 18,
wherein the second resistor is a thermistor, a resistance thermometer, or a thermocouple.

20. The semiconductor device according to claim 18,
wherein the resistance material of the second resistor includes silicon.

21. The semiconductor device according to claim 18,
wherein the first resistor is stacked over the second circuit.

22. The semiconductor device according to claim 18,
wherein the metal oxide includes zinc.

23. The semiconductor device according to claim 18,
wherein a first voltage is configured to be input to a second terminal of the first resistor, and
wherein a second voltage which is lower than the first voltage is configured to be input to a second terminal of the second resistor.

24. A vehicle comprising:
the semiconductor device according to claim 18; and
a car body.

* * * * *